United States Patent [19]

Brown et al.

[11] Patent Number: 5,019,992
[45] Date of Patent: May 28, 1991

[54] SYSTEM FOR DESIGNING INTERCOMMUNICATION NETWORKS

[75] Inventors: George T. Brown, Apalachin, N.Y.; David B. Millis, Friendsville, Pa.; Paul R. Reynolds, Morrisville, N.C.; Ronald P. Nowak, Endicott, N.Y.

[73] Assignee: International Business Machines Corp., Armonk, N.Y.

[21] Appl. No.: 414,488

[22] Filed: Sep. 29, 1989

Related U.S. Application Data

[62] Division of Ser. No. 89,201, Aug. 24, 1987, Pat. No. 4,939,668.

[51] Int. Cl.$^5$ .............................................. G06F 15/46
[52] U.S. Cl. ...................................... 364/468; 364/200; 364/275.6; 364/512; 364/900; 364/917.96; 364/513
[58] Field of Search ........ 364/468, 512, 513, 191–193, 364/200 MS File, 900 MS File, 474.24, 518–522, 149–151

[56] References Cited

U.S. PATENT DOCUMENTS

| | | | |
|---|---|---|---|
| 4,135,240 | 1/1979 | Ritchie | 364/200 |
| 4,422,158 | 12/1983 | Galie | 364/900 |
| 4,591,983 | 5/1986 | Bennett et al. | 364/403 |
| 4,604,718 | 8/1986 | Norman et al. | 364/468 X |
| 4,648,044 | 3/1987 | Hardy et al. | 364/513 |
| 4,658,370 | 4/1987 | Erman et al. | 364/513 |
| 4,700,317 | 10/1987 | Watanabe et al. | 364/512 |
| 4,768,154 | 8/1988 | Sliwkowski et al. | 364/468 |
| 4,831,546 | 5/1989 | Mitsuta et al. | 364/512 |

OTHER PUBLICATIONS

Forgue–"Think Large Scale CAO/CAM with Telecommunications" Measures, vol. 52, No. 2, 23 Feb. 1987, pp. 33–34.
"CADAM Interactive User Manual", vol. 1 (SH 20-6509) Jan. 1985 and vol. 2 (SH 20-6510)–Jan. 1985–IBM Corporation.
"Catia" 30 Design User Manual, SH 20-7069–Jul. 1986–IBM Corporation "Catia Base User Manual"–SH 20-6912–Jan. 1987–IBM Corporation.
"Interactive System Productivity Facility"–SC34-20-08–Mar. 1988, IBM Corporation.
"CMS User Guide"–SC19-6210–Dec. 86–IBM Corporation.
"MVS/Extended Architecture Overview"–GC28-13-48–Mar. 1984, IBM Corporation.
"05/US2 TSO Terminal User's Guide–GC 28-06-45–Jun. 1978 IBM Corporation".
Sieworek et al.–"Computer Structures: Principles and Examples" Chapter 32–The IBM System 138/A High Level Machine–McGraw-Hill–1982.

Primary Examiner—Joseph Ruggiero
Attorney, Agent, or Firm—Mark Levy; Arthur J. Samodovitz

[57] ABSTRACT

A system for designing an intercommunication network among a plurality of devices. The system includes a device for storing rules to meet design requirements and a mechanism connected to the device for storing rules in order to revise the rules dynamically. Also provided is a device for storing data and a mechanism connected to the device for storing data in order to revise the data. A requestor has the ability to access all rules and to revise a portion of the data. Moreover, a designer has the ability to access all rules and to revise another portion of the data, which portion has at least one subportion that cannot be revised by the requestor.

3 Claims, 25 Drawing Sheets

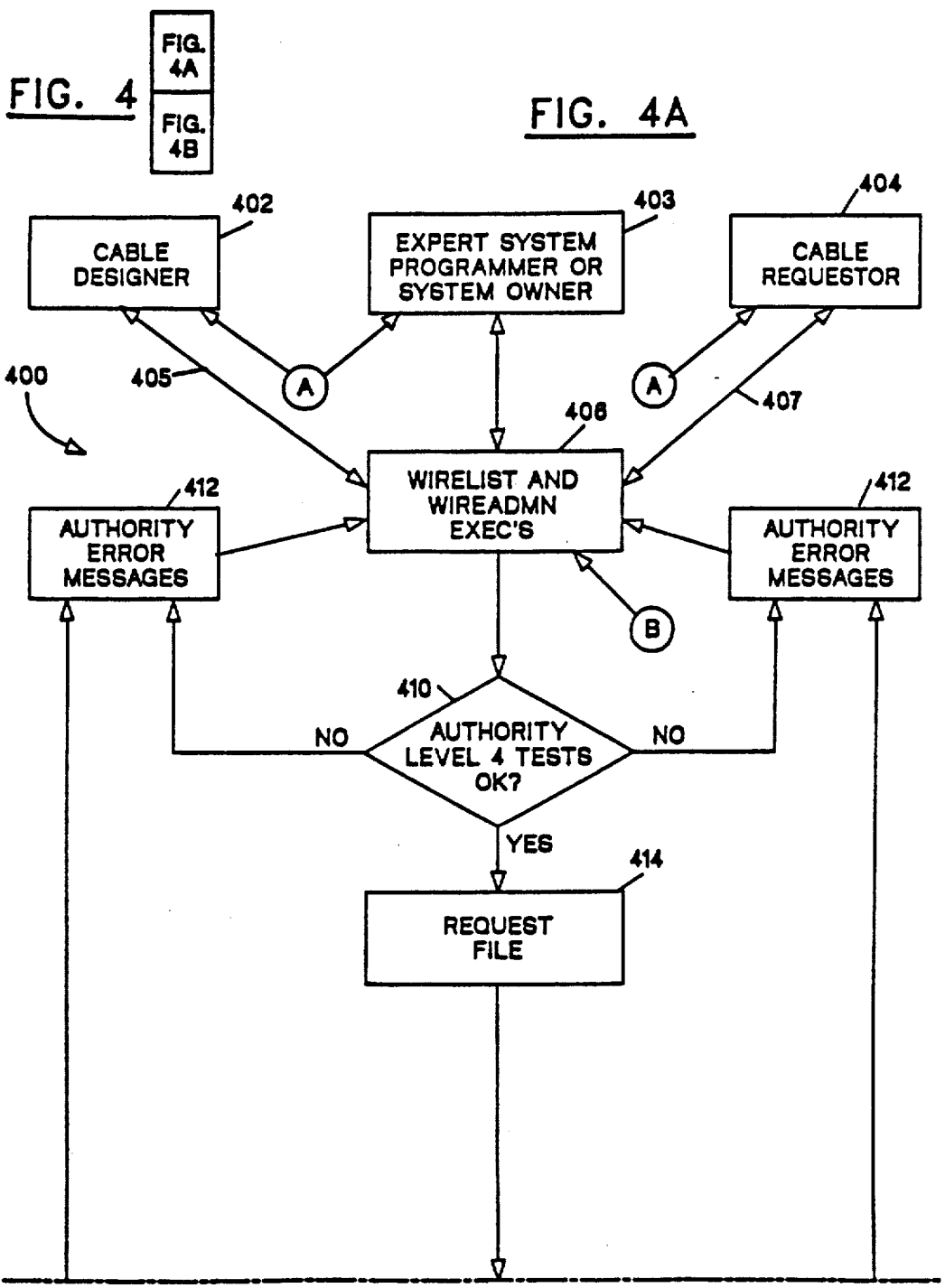

```
        WIREID:   BROWNT
      WIREADDR:   192
      WIRELABL:   TED192

DEVICE:   TB
        DEVICE:   PCC
        DEVICE:   PS
        DEVICE:   AMD

CONNECTOR:   MNL
     CONNECTOR:   BNC
     CONNECTOR:   CPCSTD                    FIG. 5
     CONNECTOR:   CPCREV
     CONNECTOR:   RING
     CONNECTOR:   SLIP-ON
     CONNECTOR:   ELSIH
     CONNECTOR:   ELSI3

STRNRELF:   NONE
      STRNRELF:   CPC
      STRNRELF:   CLAMSHELL

WIREGAGE :  16
      WIREGAGE :  18
      WIREGAGE :  20

WIRECOLOR:   BLUE
     WIRECOLOR:   WHITE
     WIRECOLOR:   RED/BLK
     WIRECOLOR:   YEL/BLK
     WIRECOLOR:   GNR/YEL
     WIRECOLOR:   CLEAR

ADDRESS:   BROWGT AT GDLPD

CONNTYPE:   DEFAULT     DEV1 : ABCDEFGIJK
      CONNTYPE:   DEFAULT     CAB1 : ABCDEFGIJK
      CONNTYPE:   DEFAULT     DEV2 : 0123456789
      CONNTYPE:   DEFAULT     CAB2 : 0123456789
      CONNTYPE:   DEFAULT     DEV3 : 0123456789
      CONNTYPE:   DEFAULT     CAB3 : 0123456789
      CONNTYPE:   DEFAULT     PINA :
      CONNTYPE:   DEFAULT     CABA :
      CONNTYPE:   DEFAULT     PINN : 1 99
      CONNTYPE:   DEFAULT     GEND : M F
      CONNTYPE:   DEFAULT     GENC : F M
      CONNTYPE:   DEFAULT     SIZE : N
      CONNTYPE:   DEFAULT     AMPS : N
```

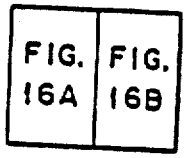
FIG. 16
| | | | FROM | | |
|---|---|---|---|---|---|
| WIRE P/N | WIRE | COLOR | LOCATION | PIN | TERMINAL |
| 0725953 | 1 | RED/BLK | PS 101 P03 | 01 | 1847520 |
| | T1 | RED/BLK | PS 101 P03 | 02 | 1847520 |
| 0725953 | 2 | RED/BLK | PS 101 P03 | 03 | 1847520 |
| | T2 | RED/BLK | PS 101 P03 | 04 | 1847520 |
| 0100550 | 3 | BLACK | PS 105 P02 | 01 | 1847520 |
| 0100550 | 4 | BLACK | PS 105 P02 | 02 | 1847520 |
| 0100550 | 5 | BLACK | K 01 02 | 01 | 4495003 |
| 0143722 | 6 | RED | K 01 04 | 01 | 4495003 |
| 0725953 | 7 | RED/BLK | PS 101 P03 | 05 | 1847520 |
| | T7 | RED/BLK | PS 101 P03 | 06 | 1847520 |
| 0143722 | 8 | RED | PS 101 P03 | 07 | 1847520 |
| 0143722 | 9 | RED | PS 101 P03 | 08 | 1847520 |
FIG. 16A
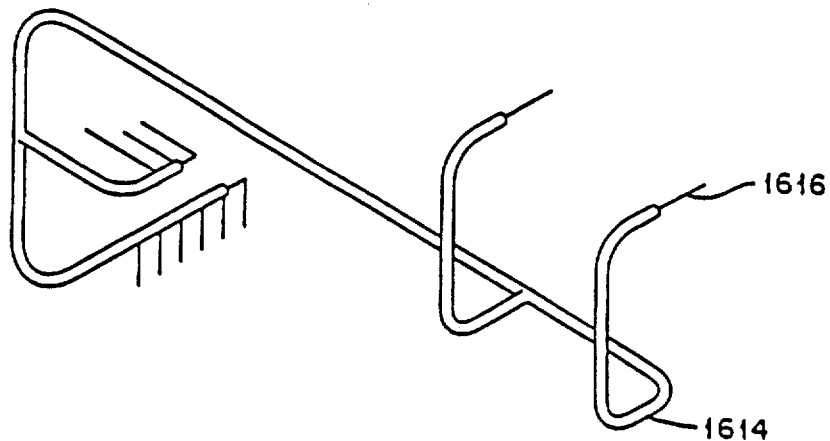

FIG. 16B

SHE 1 OF 2

| TO | | | LENGTH (MIN.) |
|---|---|---|---|
| LOCATION | PIN | TERMINAL | |
| TB 02 01 | 01 | 334910 | 855 |
| TB 02 02 | 01 | 334910 | 870 |
| TB 02 01 | 01 | 334910 | 855 |
| TB 02 02 | 01 | 334910 | 870 |
| TB 02 03 | 01 | 303545 | 995 |
| TB 02 04 | 01 | 303545 | 1010 |
| TB 02 05 | 01 | 303545 | 404 |
| TB 02 06 | 01 | 303545 | 419 |
| PS 105 P02 | 03 | 1847520 | 556 |
| PS 105 P02 | 04 | 1847520 | 556 |
| K 01 02 | 01 | 4495003 | 802 |
| K 01 03 | 01 | 4495003 | 815 |

1610

1612

```
0100550  ( 2409)  #16 BLACK      DISCRETE
0143722  ( 2036)  #16 RED        DISCRETE
0725953  ( 4562)  #16 RED/BLK    TWISTED PAIR 1847534  ( 2)  CONNECTOR
4459324  ( 3)  STRAIN RELIEF
1847520  (12)  TERMINAL
303545   ( 4)  TERMINAL
334910   ( 2)  TERMINAL
4495003  ( 3)  TERMINAL
1622538  ( 2)  SCREW
```

LAST WIRE NUMBER USED -   9
UNUSED WIRE NUMBERS- NONE
WIRE NUMBERS IN PARENTHESES IN SAME TERMINAL
S/T - SKIN AND TIN

[1] MARK CONNECTOR PLUG LOCATION AS INDICATED IN ACCORDANCE WITH ENGINEERING SPECIFICATION 899654

2    CABLE TO BE CHECKED 100% FOR THE FOLLOWING:
     A. CORRECT POSITION OF LEADS IN CONNECTORS
     B. IMPEDANCE OF GROUND WIRE MUST BE 0.1 OHMS OR LESS
     C. EACH CONNECTOR MARKED WITH A DOT IN A PERMANENT CONTRASTING COLOR IN ACCORDANCE WITH ENGINEERING SPECIFICATION 899654

[3] MANUFACTURING OPTION - USE MACHINE THREAD P/N 147440 (REF)

[4] ASSEMBLE PER REFERENCE DRAWING 378473

| WIRE P/N | WIRE | COLOR | FROM | | | | TO | | | | LENGTH (MIN.) |
|---|---|---|---|---|---|---|---|---|---|---|---|
| | | | LOCATION | | PIN | TERMINAL | LOCATION | | PIN | TERMINAL | |
| 0725953 | 1 | RED/BLK | PS 101 | P03 | 01 | 1847520 | TB 02 | 01 | 01 | 334910 | 855 |
| | T1 | RED/BLK | PS 101 | P03 | 02 | 1847520 | TB 02 | 02 | 01 | 334910 | 870 |
| 0725953 | 2 | RED/BLK | PS 101 | P03 | 03 | 1847520 | TB 02 | 01 | 01 | 334910 | 855 |
| | T2 | RED/BLK | PS 101 | P03 | 04 | 1847520 | TB 02 | 02 | 01 | 334910 | 870 |
| 0100550 | 3 | BLACK | PS 105 | P02 | 01 | 1847520 | TB 02 | 03 | 01 | 303545 | 995 |
| 0100550 | 4 | BLACK | PS 105 | P02 | 02 | 1847520 | TB 02 | 04 | 01 | 303545 | 1010 |
| 0100550 | 5 | BLACK | K | 01 | 02 | 4495003 | TB 02 | 05 | 01 | 303545 | 404 |
| 0143722 | 6 | RED | K | 01 | 04 | 4495003 | TB 02 | 06 | 01 | 303545 | 419 |
| 0725953 | 7 | RED/BLK | PS 101 | P03 | 05 | 1847520 | PS 105 | P02 | 03 | 1847520 | 556 |
| | T7 | RED/BLK | PS 101 | P03 | 06 | 1847520 | PS 105 | P02 | 04 | 1847520 | 556 |
| 0143722 | 8 | RED | PS 101 | P03 | 07 | 1847520 | K | 01 | 01 | 4495003 | 802 |
| 0143722 | 9 | RED | PS 101 | P03 | 08 | 1847520 | K | 01 | 03 | 4495003 | 815 |

0100550 ( 2409) #16 BLACK     DISCRETE
0143722 ( 2036) #16 RED       DISCRETE
0725953 ( 4562) #16 RED/BLK   TWISTED PAIR 1847534   ( 2) CONNECTOR
4459324   ( 3) STRAIN RELIEF
1847520   (12) TERMINAL
303545    ( 4) TERMINAL
334910    ( 2) TERMINAL
4495003   ( 3) TERMINAL
1622538   ( 2) SCREW

LAST WIRE NUMBER USED -     9
UNUSED WIRE NUMBERS- NONE
WIRE NUMBERS IN PARENTHESES IN SAME TERMINAL
S/T - SKIN AND TIN
[1] MARK CONNECTOR PLUG LOCATION AS INDICATED
    IN ACCORDANCE WITH ENGINEERING SPECIFICATION
    899654

*FIG. 17*

| FIG. 17A |
|---|
| FIG. 17B |

*FIG. 17A*

SHE 1 OF 2

TEXT ANGLE = 30
SLANT ANGLE = 30

TEXT ANGLE = 30
SLANT ANGLE = -30

TEXT ANGLE = -30
SLANT ANGLE = -30

TEXT ANGLE = 30
SLANT ANGLE = 30

TEXT ANGLE = -90
SLANT ANGLE = -30

SHE 1 OF 2

| WIRE P/N | WIRE | COLOR | FROM LOCATION | FROM PIN | FROM TERMINAL | TO LOCATION | TO PIN | TO TERMINAL | LENGTH (MIN.) |
|---|---|---|---|---|---|---|---|---|---|
| 0725953 | 1 | RED/BLK | PS 101 P03 | 01 | 1847520 | TB 02 01 | 01 | 334910 | 855 |
|  | T1 | RED/BLK | PS 101 P03 | 02 | 1847520 | TB 02 02 | 01 | 334910 | 870 |
| 0725953 | 2 | RED/BLK | PS 101 P03 | 03 | 1847520 | TB 02 01 | 01 | 334910 | 855 |
|  | T2 | RED/BLK | PS 101 P03 | 04 | 1847520 | TB 02 02 | 01 | 334910 | 870 |
| 0100550 | 3 | BLACK | PS 105 P02 | 01 | 1847520 | TB 02 03 | 01 | 303545 | 995 |
| 0100550 | 4 | BLACK | PS 105 P02 | 02 | 1847520 | TB 02 04 | 01 | 303545 | 1010 |
| 0100550 | 5 | BLACK | K 01 02 | 01 | 4495003 | TB 02 05 | 01 | 303545 | 404 |
| 0143722 | 6 | RED | K 01 04 | 01 | 4495003 | TB 02 06 | 01 | 303545 | 419 |
| 0725953 | 7 | RED/BLK | PS 101 P03 | 05 | 1847520 | PS 105 P02 | 03 | 1847520 | 556 |
|  | T7 | RED/BLK | PS 101 P03 | 06 | 1847520 | PS 105 P02 | 04 | 1847520 | 556 |
| 0143722 | 8 | RED | PS 101 P03 | 07 | 1847520 | K 01 02 | 01 | 4495003 | 802 |
| 0143722 | 9 | RED | PS 101 P03 | 08 | 1847520 | K 01 03 | 01 | 4495003 | 815 |

0100550 ( 2409) #16 BLACK      DISCRETE
0143722 ( 2036) #16 RED        DISCRETE
0725953 ( 4562) #16 RED/BLK    TWISTED PAIR 1847534  ( 2) CONNECTOR
4459324  ( 3) STRAIN RELIEF
1847520  (12) TERMINAL
303545   ( 4) TERMINAL
334910   ( 2) TERMINAL
4495003  ( 3) TERMINAL
1622538  ( 2) SCREW

LAST WIRE NUMBER USED - 9
UNUSED WIRE NUMBERS- NONE
WIRE NUMBERS IN PARENTHESES IN SAME TERMINAL
S/T - SKIN AND TIN
☐ MARK CONNECTOR PLUG LOCATION AS INDICATED
   IN ACCORDANCE WITH ENGINEERING SPECIFICATION

FIG. 19A

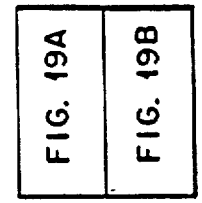

| FIG. 19A |
|---|
| FIG. 19B |

FIG. 19

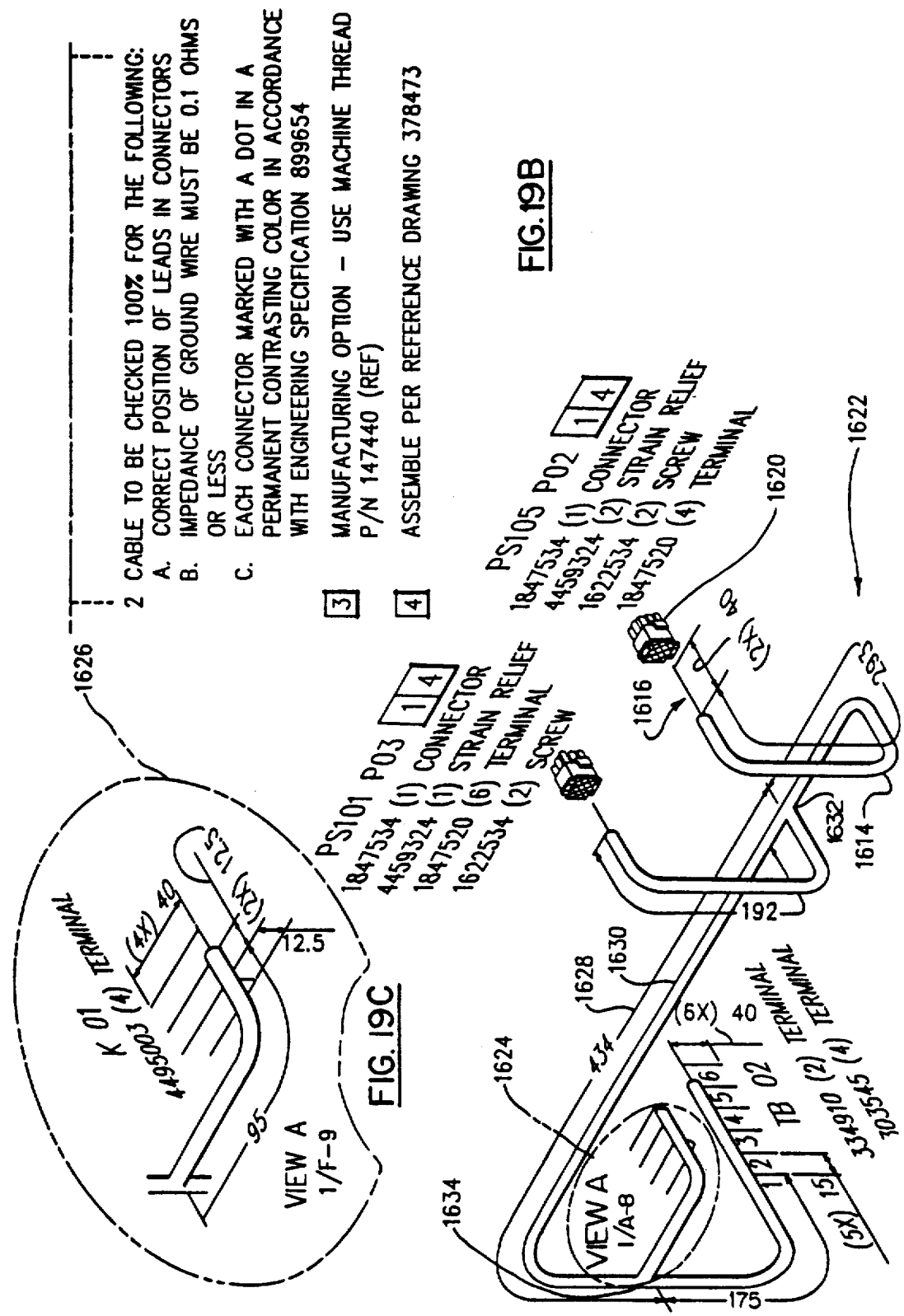

FIG. 20

| WIRE P/N | WIRE | COLOR | FROM | | TO | | LENGTH (MIN.) |
|---|---|---|---|---|---|---|---|
| | | | LOCATION PIN | TERMINAL | LOCATION PIN | TERMINAL | |
| 0725953 | 1 | RED/BLK | PS 101 P03 01 | 1847520 | TB 02 01 01 | 334910 | 855 |
| 0725953 | T1 | RED/BLK | PS 101 P03 02 | 1847520 | TB 02 02 01 | 334910 | 870 |
| | 2 | RED/BLK | PS 101 P03 03 | 1847520 | TB 02 01 01 | 334910 | 855 |
| | T2 | RED/BLK | PS 101 P03 04 | 1847520 | TB 02 02 01 | 334910 | 870 |
| 0100550 | 3 | BLACK | PS 105 P02 01 | 1847520 | TB 02 03 01 | 303545 | 995 |
| 0100550 | 4 | BLACK | PS 105 P02 02 | 1847520 | TB 02 04 01 | 303545 | 1010 |
| 0100550 | 5 | BLACK | K 01 02 01 | 4495003 | TB 02 05 01 | 303545 | 404 |
| 0143722 | 6 | RED | K 01 04 01 | 4495003 | TB 02 08 01 | 303545 | 419 |
| 0725953 | 7 | RED/BLK | PS 101 P03 05 | 1847520 | PS 105 P02 03 | 1847520 | 556 |
| | T7 | RED/BLK | PS 101 P03 06 | 1847520 | PS 105 P02 04 | 1847520 | 556 |
| 0143722 | 8 | RED | PS 101 P03 07 | 1847520 | K 01 02 01 | 4495003 | 802 |
| 0143722 | 9 | RED | PS 101 P03 08 | 1847520 | K 01 03 01 | 4495003 | 815 |

1610

SYSTEM FOR DESIGNING INTERCOMMUNICATION NETWORKS

This is a division of U.S. patent application Ser. No. 089,201 filed by George T. Brown et al. on Aug. 24, 1987, now U.S. Pat. No. 4,939,668.

RELATED APPLICATIONS

The present invention is particularly directed to use in an automated cable design system which will employ varying features and functions, described in differing aspects, in any one or more of the following group of copending patent applications, all filed concurrently on Aug. 24, 1987:

EN987028 to G. T. Brown et al for "System for Designing Intercommunication Networks," Ser. No. 07/089,201, now U.S. Pat. No. 4,939,668;

EN987029 to R. J. Cicciarelli et al for "System for Ensuring Device Compatibility," Ser. No. 07/089,200, now U.S. Pat. No. 4,870,590;

EN987030 to D. B. Millis for "System for Providing Three Dimensional Object Descriptions," Ser. No. 07/088,925, now U.S. Pat. No. 4,928,233;

EN987031 to G. R. Aldrich et al for "Method for Producing Building Instructions for Three Dimensional Assemblies," Ser. No. 07/088,924;

EN987032 to G. R. Aldrich et al for "Method for Producing Installation Instructions for Three Dimensional Assemblies," Ser. No. 07/088,916.

BACKGROUND OF THE INVENTION

The present invention relates to a system for designing a network and more particularly to a system for designing an intercommunication network among a plurality of devices by the use of revisable rules and data.

Design of network systems such as wire cables used for power or signals, plumbing fixtures and pipes, heating, ventilation and air conditioning duct work, aircraft mechanical cabling, pneumatic tubes and the like heretofore generally has been manual. For the purpose of brevity the word cable is used hereinbelow to represent all such elements appropriate to varied environments, such as, but not limited to, wire for electrical systems, pipes for plumbing systems and tubes for pneumatic systems and the like. Wire, pipe or tube lengths, for example, are conventionally determined or estimated by various methods including measuring string on a mockup scale or life-sized physical model of a product or building or by digitizing engineering drawings.

Resulting computer generated or manually generated engineering drawings are symbolic, which is a disadvantage when designing a network. Such symbolic manufacturing drawings are usually not geometrically accurate nor are the dimensions accurate. The final engineering drawing, while generally to standards, is symbolic, so the drawing does not resemble a cable.

Cable routing drawings suffer from another disadvantage: conventionally they are more descriptive than pictorial. When cables require sequential assembly, computer aided models are so complex as to be almost invariably incomplete even after several revisions. Their level of complexity and degree of completeness are inversely related to the ease by which assemblers or installers can decipher the drawings that describe the network. The only task not manually performed has been the process of drafting engineering drawings, which task is often accomplished by a computer aided design system. Even here, administrative data as well as geometric data needed for drafting is usually accumulated manually.

Network and especially cable design has traditionally involved less than accurate methods. Requests to have cables designed were often incomplete. This was due to the communications medium between the cable designer, who belongs to a first class of user, and people requesting cables, who belong to a second class of user, being inaccurate, hand written notes.

In a manual system of designing, when a number of designers provide information over the course of the project, the data that is actually entered can bear less than strict resemblance to that which was intended. That is, the information that is transferred from one designer to another or from one designer to an anthologizer may be distorted, missing or otherwise incomplete. One step toward solving this problem has been described in the article "Think Large Scale CAD/CAM With Telecommunications" by B. Forgue, Mesures, Vol. 52, No. 2, 23 February 1987, pp. 33-34. This article discloses a network that conveys data between a central office and 12 regional offices for the manufacturer of corrugated cardboard cartons. A graphics database is continuously updated by 60 designers. Three dimensional packages are designed around the product to be contained and corresponding flattened shapes and sizes are formed by folding and unfolding on a CRT display. All 60 designers in the system are considered to be in the same class and each of them is responsible for describing the corrugated box being designed. In the aforementioned system, the design requirements are relatively rudimentary so there is no need for another class of individuals to provide information to the system in order to guarantee completeness thereof.

U.S. Pat. No. 4,422,158 issued to Galie discloses a digital data processing system and a query composed of entries to locate items that are stored in a multiple layer data base. The entries have one or more event types and the database includes items that have either an exact or inexact match with entries of the query. The query and a first one of the database layers are processed to form packages having an assigned order. The packages contain representations of the event types in a second layer of the database and representations of the degree of match between the entry in the first layer and an entry of the query. As a result, the representations of the furthest degree of match represent the degree of match of the query to both the first and second layers of the database. Only one class of users can use the aforementioned system at a time. Accordingly, no provision is made for a second class of users to interact with the first class to complete technical descriptions of the items in the database.

U.S. Pat. No. 4,648,044 issued to Hardy et al describes a tool for building a knowledge system and running a consultation on a computer. The knowledge system includes a knowledge base having English-like language expressing facts, rules and meta-facts for specifying how rules are to be applied to solve a specific problem. The tool includes interactive knowledge base debugging, question generation, legal response checking, explanation, certainty factors and the use of variables. A knowledge engineer in the aforementioned system creates the entire expert system prior to its use. A consultation user represents a single class of user and does not interact with the knowledge engineer. Thus, the consultation user himself is responsible for providing enough information to obtain a complete answer to his own queries.

U.S. Pat. No. 4,658,370 issued to Erman et al discloses a tool for knowledge engineers for building and interpreting a knowledge base having separate portions. Portions include encoding control knowledge, factual knowledge and judgmental rules. The tool has an inference engine applying the judgmental rules according to a built-in control procedure defining discrete states or control steps during a consultation with the user. The tool can be used to build knowledge systems that can explain their conclusions and reasoning and are intelligible and modifiable. The knowledge engineer may provide control blocks to be executed at the start of the consultation, after the instantiation of specified classes, when a value for a specified attribute is to be determined, after a specified attribute is determined and upon explicit invocation by another control block. Once again, there is only one class of user. A knowledge engineer in the aforementioned system creates the entire expert system prior to its use. A consultation user represents another class of user and does not interact with the knowledge engineer. Thus, the consultation user is responsible for providing enough information to obtain a complete answer to the queries that he himself poses.

Network connections such as cabling are often designed last. This is symptomatic of last minute changes in the design of subassemblies that require cables. The time associated with completing a given product must often be lengthened because network connections cannot keep up with latest design changes.

As a result of the aforementioned factors, cable designing for development projects has usually been inefficient and frequently inaccurate.

It would be advantageous to provide a digital system to allow only a few requestors to create a cable description.

It would further be advantageous to provide a digital system to allow only a few cable designers to design a network of completed cable descriptions.

It would also be advantageous for the invention, once developed, to be practiced by any person using similar hardware.

Moreover, it would be advantageous to allow two classes of users to supply complete cable descriptions.

SUMMARY OF THE INVENTION

In accordance with the present invention, there is provided a system for designing an intercommunication network among a plurality of devices. The system includes a device for storing rules to meet design requirements and a mechanism connected to the device for storing rules in order to revise the rules dynamically. Also provided is a device for storing data and a mechanism connected to the device for storing data in order to revise the data. A requestor has the ability to access all rules and to revise a portion of the data. Moreover, a designer has the ability to access all rules and to revise another portion of the data, which portion has at least one subportion that cannot be revised by the requestor and at least one other portion that can be.

BRIEF DESCRIPTION OF THE DRAWINGS

A complete understanding of the present invention may be obtained by reference to the accompanying drawings, when taken in conjunction with the detailed description thereof and in which:

FIGS. 4, 4A and 4B show a flow chart of the WIRELIST program;

FIG. 5 is a simple default values file;

FIGS. 16, 16A, and 16B are a solid representation of a cable with wire leads and certain administrative data created by the SELECTOR CLIST as they first appear in CADAM;

FIGS. 17, 17A, and 17B are the content of FIG. 16 with minibills and connector views;

FIGS. 19, 19A, and 19B are the content of FIG. 16 completed and including dimensions;

FIG. 20 is a point to point wiring table in CADAM; and

DETAILED DESCRIPTION OF THE PREFERRED EMBODIMENT

Figure 1:
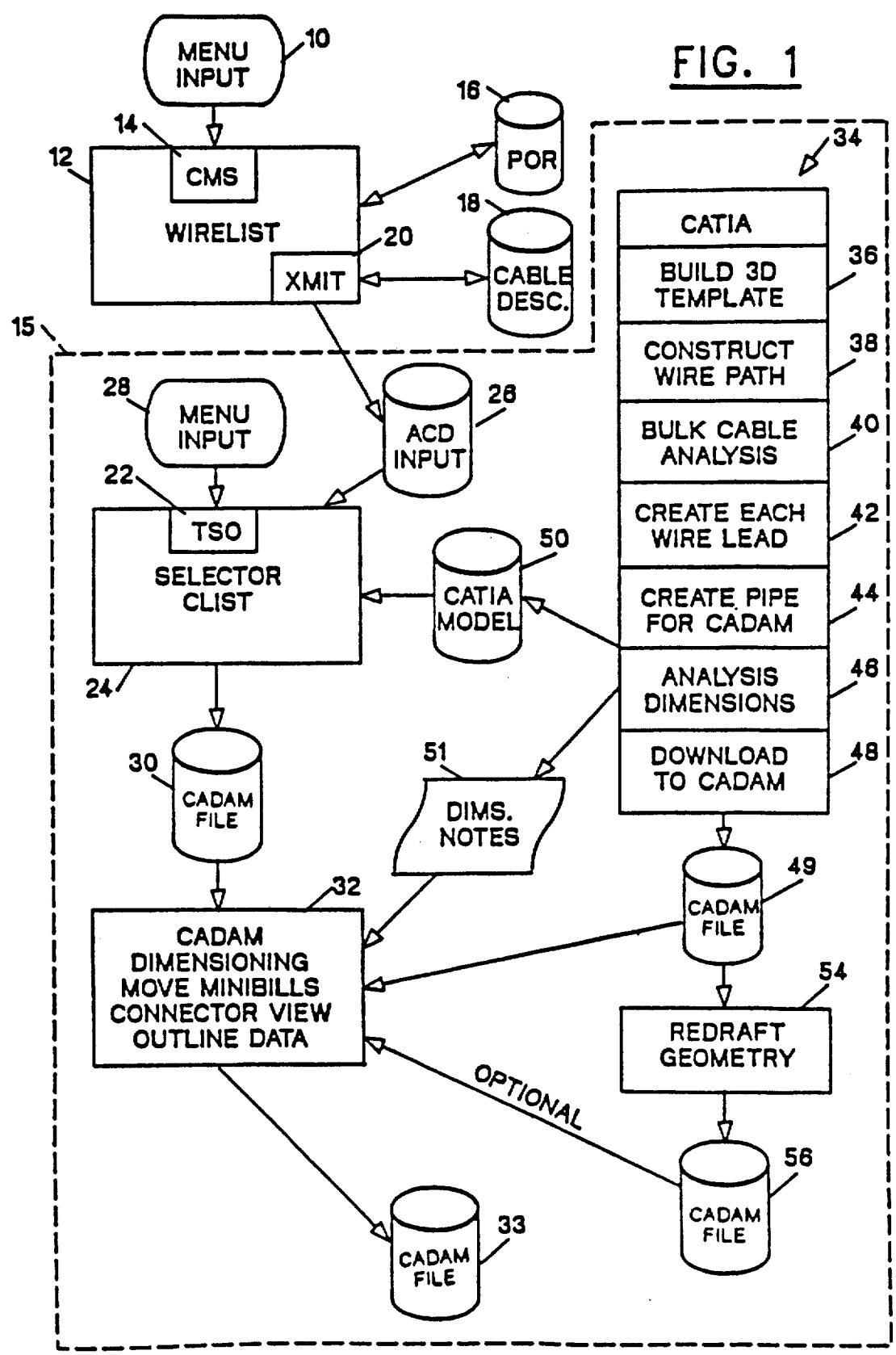
FIG. 1 is a block diagram showing the overall collection of projects of which the present invention is one.

The present invention is one of a collection of projects that can be thought of as two design processes. The inventive project is related to the administrative process that describes an element used to connect devices to one another.

Administrative data is any alphanumeric character or text that is entered automatically into a computer aided design system such as a CADAM system. CADAM is a trademark of Cadam, Inc. The CADAM system is described in further detail in "CADAM User Reference Manual" available from Cadam, Inc. as document C-030-001-U. Administrative data includes point to point wire data and a bill of materials. It does not include geometric information.

Other design projects hereinabove mentioned use a three dimensional mechanical design system such as a CATIA system. CATIA is a trademark of Dassault Systemes. The CATIA system is described in further detail in "CATIA Basic Reference Manual", for example, available from IBM Corp. as document SH20-6912. The mechanical design system generates geometrically and dimensionally accurate computer aided models as well as pictorial cable routing drawings. Another project loads the results into a CADAM system.

The aforementioned geometric and administrative design processes are independent but for two events. The first event occurs when actual wire lengths are derived from the geometrically accurate CATIA model and placed in the administrative data. The second event occurs when all results from both processes are loaded into the CADAM model representing the isometric cable representation with administratively matched descriptive data.

In accordance with the present invention, events in the preferred embodiment occur in the following order. A digital plan of record of supporting devices is created using a computer suitable for executing a virtual machine (VM) program. The cable administrative data is similarly entered and then the geometry is created using the CATIA system. Finally, data is loaded into CADAM and both a CADAM assembly model and a CADAM installation model are completed.

Heretofore, operations have involved a non-digital interface between the person or group requesting a cable and the cable designers. This has usually been accompanied by last minute requests and has typically omitted certain information. The cable designer was often behind schedule before being supplied enough data to start the designed project.

Prior to using the projects described hereinbelow, a user specifies product related information in several forms. As part of building the plan of record, the user must specify a list which includes the product, valid devices and connector families. The software cross checks to ensure that the cable design does not violate these rules.

Typical database management requires the services of a database administrator from a support area. The database is completely maintained by the user. Only part numbers that are intended to be used by the designer are entered by the designer.

Prior to executing the software to collect cable hardware part numbers from cable descriptions, the user enters the part number for any cable hardware expected to be used. The part number is entered once, regardless of how many times the part is used. When several designers use the same tables, each person can add whatever part numbers are needed. The database created in this way is relatively small and easily maintained by designers using an editor in menu driven software, such as the System Productivity Facility (SPF). SPF is described in further detail in "Interactive System Productivity Facility Programmer's Guide" available from IBM Corp. as document SC34-2088. If certain data is forgotten, the user can add it later, after the SELECTOR program, hereinbelow described, indicates what is missing. Although it is more productive to complete the database before executing the SELECTOR program, it is not unusual to omit certain information during initial database loading.

Referring now to FIG. 1, there is shown a block diagram of the network design process in accordance with the present invention.

Cable descriptive information 10 is entered digitally by the requesting group, not shown, and subsequently completed by the cable designer, not shown. This descriptive data 18 initially resides on a computer system and replaces conventional manual methods. The software that initiates and maintains the plan of record 16, descriptive data entry and database management of completed network descriptions is called WIRELIST 12. The WIRELIST program 12 runs on a virtual machine (VM) operating system. The preferred embodiment uses the IBM conversational monitoring system (CMS). Both VM and CMS are described in further detail in "VM/CMS General Information Manual" available from IBM Corp. as document GC19-6221.

The WIRELIST VM data entry program 12 (hereinafter called WIRELIST) has two main functions: (a) record and store the plan of record 16, and (b) collect, store and transmit the description of each cable to the Mechanical Design Automation (MDA) system, referred to generally as reference numeral 15. The MDA system 15 operates under MVS/XA, described in further detail in "MVS/XA Overview" available from IBM Corp. as document GC28-1348.

With WIRELIST 12, the requestor can supply complete descriptive information at an early stage and cable designers can begin cable design before the geometry can be started. WIRELIST 12 is an expert system to which can be provided lists of acceptable answers in the form of a default values file, hereinbelow described in further detail. The program 12 verifies that the requestor and cable designer are following their own plan of record 16. The plan of record 16 can be modified only through special authorization.

WIRELIST 12 allows only the requestor to supply data to certain fields and only the cable designer to supply data to others. Moreover, the program 12 ensures that neither person fails to supply complete information under his or her respective class of user responsibility. Furthermore, either person can supply at least one field of overlapping data. WIRELIST 12 also checks to be sure that no data is missing.

When WIRELIST cable description data is transmitted by means of a transmitter (XMIT) 20, it is automatically added as a member in a Time Sharing Option (TSO) 22 partitioned data set 26 with the member name equal to the letter P followed by the seven character part number. TSO is described in greater detail in "TSO Terminal User's Guide" 60 available from IBM Corp. as document GC28-0645. The user need refer to a cable by part number only. The MDA system 15 handles data management of these cable descriptions 18 and 26.

The general content of the cable description 18 is physical. For example, the description might indicate that the cable terminates with a Mate-N-Lok brand connector of specific physical properties, such as 12 pins. (Mate-N-Lok is a trademark of AMP, Inc.) The cable description does not include the 12 pin Mate-N-Lok connector part number. The user is not expected to remember component part numbers each time they are used but is expected to have recorded it once in the tables of the database prior to using it.

Referring again to FIG. 1 and starting with a specified cable description 26 from WIRELIST 12, the user executes a series of software programs referred to as SELECTOR CLIST 24. These programs 24 obtain the length data for a specified cable from geometric CATIA models 50, add the length data to the cable description 26, find the part number data for all component parts and load and file all the administrative data on that cable into a CADAM model 30. The user indicates the cable part number to process and the appropriate CATIA model name. The same name is used for the resultant CADAM model name. The CATIA FILE name, which is also the user's CADAM subgroup, is entered in response to the SELECTOR CLIST by the user and the desired selected notes to be added to the final CADAM drawing are indicated by the user. The procedure for labelling wires in the CATIA model 50 so that they will be added to the cable description 26 is described hereinbelow. The main part of the aforementioned sequence of programs 24 is the SELECTOR program hereinafter described and hereinbelow referred to as SELECTOR. The purpose of SELECTOR is to match physical data from the cable description 26 and the tabular part number database, not shown, to determine the part numbers needed.

The number of tables depends on the variety of connector families used in the product. The word connector is used hereinbelow to designate an originating or a terminating point of a network. Connectors can be electrical outlets and terminals, mechanical joints and fixtures and the like.

SELECTOR generates five types of administrative data that are required for release drawings. SELECTOR also formats the results in preparation for loading to the CADAM model 30.

The second process shown in FIG. 1 is the geometric cable design in the CATIA system 34, with subsequent download to the CADAM system. The CATIA portion of this description is shown in flow chart form and identified generally by reference numeral 34. Frame components and other geometry affecting cable design are gathered into a single CATIA model called a three dimensional template, step 36. These items are solids, previously created by other designers. Wires are next routed along frame members and related paths using CATIA lines and similar one dimensional geometric constructs, step 38. The constructs are concatenated to create a single CATIA arc for each wire, step 42. Later, software gathers the actual length data and includes it in the descriptive data 26 so that the bill of materials specifies the amount of wire needed.

Bulk cable analysis is performed, step 40, by using the CATIA PIPE function and the wire as the center of the cable. The PIPE function is later used, step 44, to create the isometric view for CADAM. The geometry is analyzed in CATIA, step 46, and recorded on a screen copy of the view 51 for subsequent inclusion in CADAM 32. When completed, the designer first downloads to the CADAM system 49 the isometric view of the wires and then the isometric view of the wires with the background solids, step 48. The first download is combined with the descriptive data from the administrative process to create the cable assembly drawing. The second download is used as the basis for the cable routing drawings. Both drawings reside in CADAM FILE 33. Both models may be run through a REDRAFT program 54 as described hereinbelow to the CADAM FILE 56. This is optional and will depend on individual design techniques. Dimensioning is performed by using the CADAM system 32. The aforementioned CATIA process 34 results in a CATIA model 50.

Although the aforementioned programs can be executed embodiment is as follows. WIRELIST 12 should be executed first and the cable description 18 should be completed. The cable should be designed in CATIA 34 and the model 50 saved. The SELECTOR CLIST 24 should be executed and then the CATIA geometry should be downloaded, step 48, to CADAM FILE 49. Finally, the results should be combined with the SELECTOR CLIST results 30 to produce the final data 33.

Figure 2:
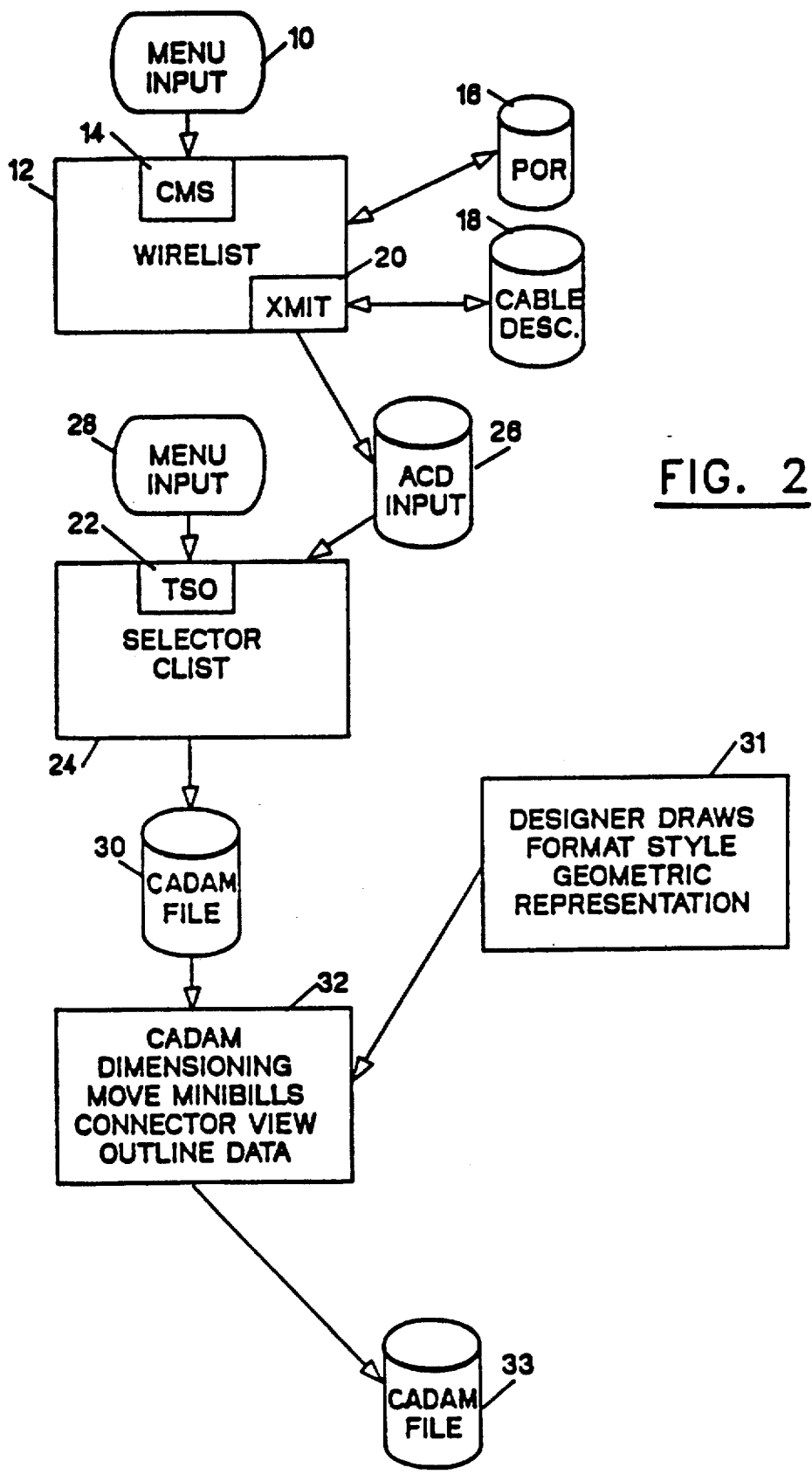
FIG. 2 is a block diagram showing the administrative design process that can be used independently of a geometric design process.

Referring now also to FIG. 2, the administrative procedure may be used independently of the geometric procedure if the designer chooses to draw a conventional symbolic, two dimensional, representation 31. Geometric length data must be entered manually before running the SELECTOR CLIST 24 or the bill of materials will not contain specific data on the amount of wire required.

Figure 3:
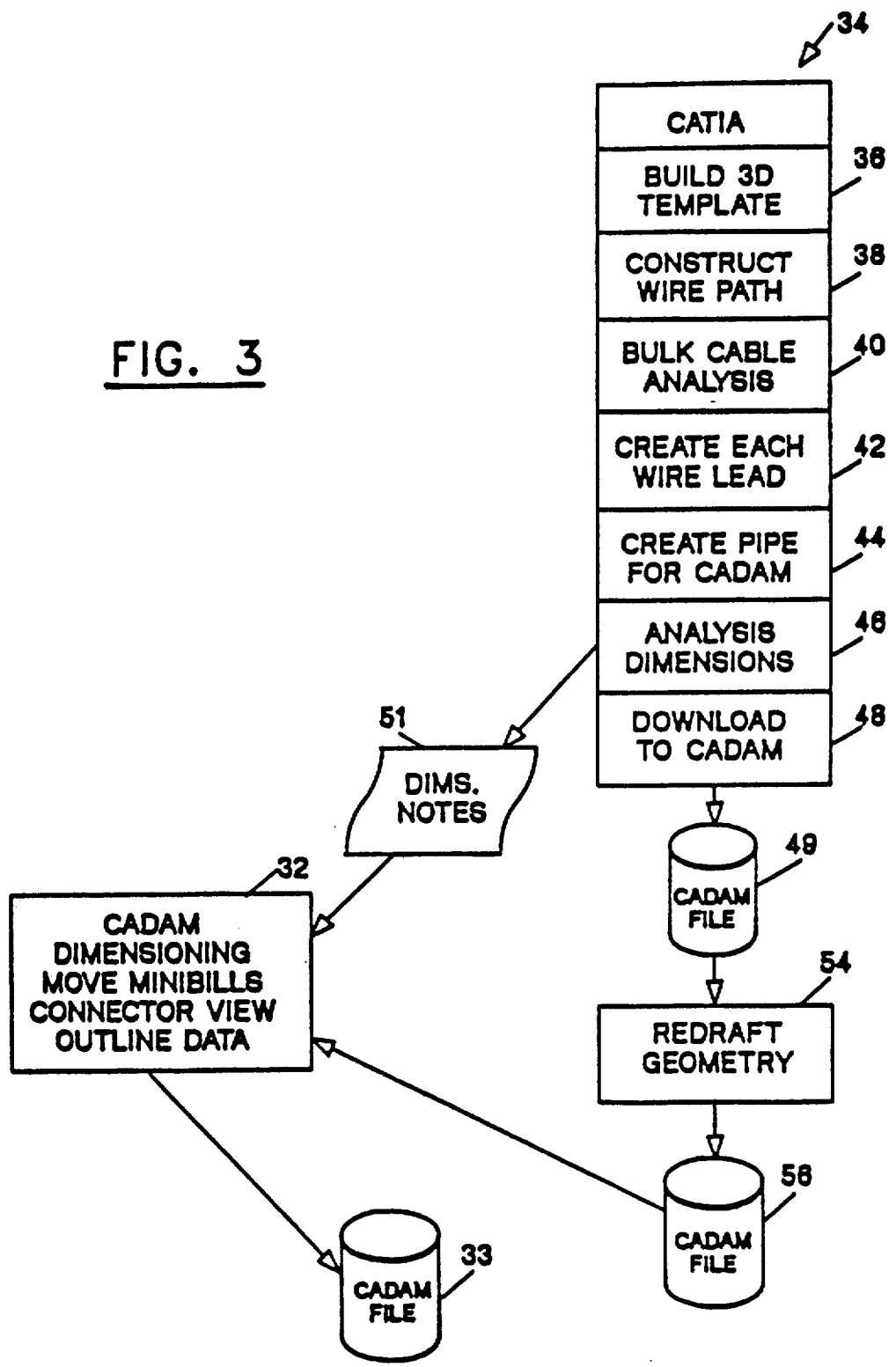
FIG. 3 is a block diagram showing the geometric design process that can be used independently of a administrative design process.

Referring now also to FIG. 3, the geometric procedure may be used independently of the administrative procedure, if the designer can enter the administrative data manually, step 52.

Actual labor saved is significant. Cycle time is also reduced. All savings realized are a direct result of pre-preparation of administrative data before preparation of CATIA geometry and before creation of the CADAM released drawings in the new formats. This allows design of cables in parallel with other mechanical parts.

Alternate variations usually have drawbacks, but may be acceptable for certain cables. Downloading the geometry before running SELECTOR CLIST 24 is one example. The drawback is that if a problem exists in the CATIA model 50 that is identified by SELECTOR, then the download must be repeated. Another example is to run SELECTOR before the three dimensional design is complete. The advantage is that the administrative data can be checked before the geometry is complete. The check, however, does not include adding the actual wire length data into the wiring point to point table and totalling the wire length data for the bill of materials.

While a designer may use both the administrative and the geometric design processes, it should be understood that the administrative description of a cable can be completed, except for actual wire lengths, even before the geometry for cabling is available.

One of the advantages of the preferred embodiment is the quality of cable routing drawings and displays. Assembly instructions are pictorial rather than descriptive. The drawings display a cable in place, highlighted while background solids are of normal intensity. Alternatively, color can be used to separate the cable from background hardware. Moreover, color can be extended to identify multiple cables in an assembly sequence so that a single drawing can be used to aid in assembling many cables.

For clarity, the cable designer should add to this drawing any other cables that would be already be installed. These cables should be at low intensity to match the template. Because there may be extensive amounts of data, the other cables may be stored in another CADAM model with an overlay number in the CADAM model name.

The sequence of cable installations must be clarified because cables are not recognizable from their geometry. Actual cable is usually supplied coiled in a plastic bag and does not appear as a three dimensional isometric view. Further identification on the cable routing drawing is required in the form of a part number that represents the cable assembly that is to be installed just prior to the current one. Alternately, a color coded container can be used to differentiate the cable. The color coding of the container can be selected to match the color coding scheme of the cable installation sequence.

Cable documentation in field manuals and customer manuals has always been tedious and complicated. Extreme care must be taken to assure that all information is present and, where it is duplicated, that it is consistent. The author of such documentation may capture either the assembly or the installation drawing as desired and imbed it directly into a document file. Preparation by the author or at his request requires only erasing extra information from the CADAM model 33. Similarly, CATIA graphics can be used in lieu of CADAM graphics, resulting in earlier availability of customer documentation.

The present system uses CATIA to define the length of each lead accurately. Operationally, this length may be too short. This phenomenon seems to occur because the cables are created on a two dimensional pegboard and then coiled and bagged for shipment to the assembly area. Uncoiling can leave the cable short by an amount that can only be estimated. Parameters affecting the shrinkage include the length between functional bends, the number of leads and the wire size. Other effects that leave unmeasurable changes are the tightness of the coil and the effort spent trying to straighten it.

Shrinkage of cables can be compensated for by empirical observations resulting in a knowledge based system applied to the CATIA model 50 during the transfer of length data by the SELECTOR CLIST 24 to the cable description 26. A percentage increase as a function of cable section length and bulk diameter is computed and applied by the knowledge based system. The results are reflected in the point to point wiring table and the bill of materials.

WIRELIST Expert System

WIRELIST 12 is designed to be self contained on one machine. WIRELIST 12 is a program that performs the first part of the administrative design process. Its function includes setup and maintenance of the cable plan of record, cable descriptive data entry and database management of completed cable descriptions. WIRELIST 12 also transmits the cable descriptions to the MDA system 15.

WIRELIST 12 comprises two CMS user written commands (EXECs): WIRELIST EXEC and WIREADMN EXEC. These two EXECs execute REXX programming code stored in files having a filetype of XEDIT.

WIRELIST 12 is an expert system capable of cross-checking input against a flexible list of valid entries. For example, after a list of valid connector families is entered, the program 12 requires that users choose a connector from those on the list. The list becomes part of the digital plan of record 16 generated by WIRELIST 12. The program 12 verfies that the list of connectors is used. Only authorized users, as determined by WIREADMN EXEC, can change the plan of record 16. Similarly, only authorized users can add or change the cable description 18, which is generated by WIRELIST 12.

The cable description 18 is a file for each cable. Its content is described hereinbelow. Through specific authorizations, cable specification fields can be supplied only by the requesting person; for other fields, however, only the cable designer may enter the data.

When a cable has been completely described, the description thereof 18 is sent via a transmit mechanism, XMIT 20, to the MDA system 15 which supports CADAM 32, CATIA 34, and TSO 22 systems and is stored in a partition data set 26.

One of the members of the design group (i.e., the group leader or the lead cable designer) is designated as the owner of WIRELIST 12. After logging on, this owner can start another USERID, which is the system logon for WIRELIST 12. The owner can also suspend program execution and make required password changes when necessary. The system logon runs independently of the owner and continues to run even if the owner logs off. All changes, additions and deletions made by the requestor or designer are actually made by the system logon. The system logon, once started, runs regardless of the number of users logged on unless stopped by the owner.

Figure 4B:
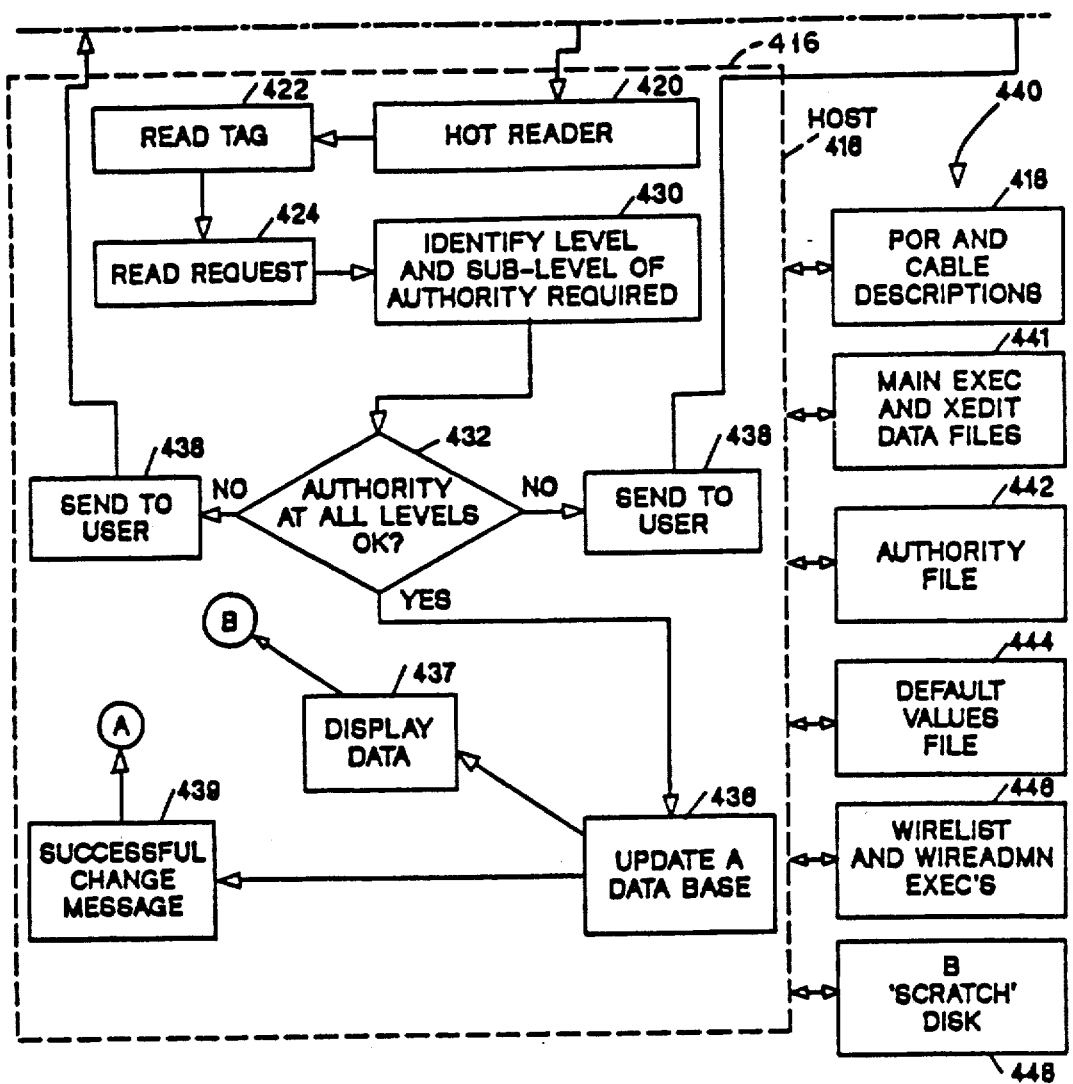

Referring now also to FIG. 4, there is shown a schematic program flow of WIRELIST 12, referred to generally as reference numeral 400. One or more designers 402 and one or more cable requestors 404 represent two classes of users, respectively. Both classes 402 and 404 execute the same programs, WIRELIST EXEC and WIREADMN EXEC 406. The distinctions of class are made through the authorization files, hereinbelow further described.

An expert system programmer and/or an owner of the system 400, referred to as reference numeral 403, represent a higher privileged operator class. This class also uses the programs 406 for controlling certain authorization and default values files.

WIRELIST EXEC 406 is used to create a plan of record 16 (FIG. 1), generate cable descriptions 18 and transmit cable descriptions 18 via XMIT 20 to the MDA system 15. All of the aforementioned functions are handled by an XEDIT data set named WIRELIST XEDIT. The WIRELIST EXEC 406 also initiates operation of two other XEDIT data sets: WIRELABL XEDIT and WIREOPTS XEDIT.

While WIRELIST XEDIT is modifiying the plan of record 16, the list of devices can be displayed and any of the following activities can proceed: starting a new device; editing an existing device; or printing a report describing a device. The word device as used herein can mean any designed, such as power supplies, terminal blocks, circuit breakers and the like.

A WIREDEV XEDIT data set is provided when a device is to be edited by the WIRELIST XEDIT data set. The WIREDEV XEDIT data set is capable of checking connector data, deleting a connector, adding a connector, changing a connector or saving the above modifications when desired by an authorized user 402 or 404.

The second major function of the WIRELIST XEDIT data set is to display a list of cables. From the list of cables, the user 402 or 404 can decide to start a new cable, edit an existing cable, change a cable part number, change a cable engineering change (EC) number, send a cable description 18 to CADAM or print a report describing the cable.

If the user 402 or 404 decides to edit an existing cable, a WIRECAB XEDIT data set is utilized. The WIRECAB XEDIT data set allows the user 402 or 404 to verify wire data, delete a wire, add a wire, change a wire or save any of the aforementioned modifications.

In the course of using WIREDEV XEDIT or WIRECAB XEDIT, before modifications are saved, the system determines whether the user 402 or 404 is authorized to make them. This function of authorization verification is accomplished by means of a data set named WIREAUTH XEDIT. Moreover if, during the course of using WIRECAB XEDIT or WIREDEV XEDIT or WIRELIST XEDIT or WIRELABL XEDIT data sets, user 402 or 404 desires instructions on the use thereof, the WIREHELP XEDIT data set can be accessed for those instructions.

The owner of the WIRELIST system 403, who is also the WIRELIST administrator, uses the WIREADMN EXEC 406 to enter control data. The WIREADMN EXEC 406 comprises two data sets: WIREAOPT XEDIT and WIREADMN XEDIT. The WIREAOPT XEDIT data set is an authorization file. The WIREADMN XEDIT data set performs updates on cable/device files. Such updates include changing the owner of a cable or device, performing remote checking of a cable or device, copying, deleting or renaming a cable or device and changing a connector name globally.

WIREADMN XEDIT also updates the default values file by means of a data set named WIREDFVL XEDIT, updates authorizations of those with access to the WIRELIST program by means of a data set named WIRECNTR XEDIT and updates authorizations for those who may use individual machines by means of a data set named WIREMAUT XEDIT.

WIRELIST authorizations are updated by means of the WIRECNTR XEDIT data set which controls the authorization as to which users 402 or 404 are authorized to change the WIRELIST files and/or change cables and devices.

The WIREMAUT XEDIT data set determines authorizations for users 402 or 404 who can change part numbers and EC numbers, can send a cable description to CADAM, can update the description of devices and cables and can request print outs of such descriptions.

The WIREDFVL XEDIT data set can be accessed by the WIREADMN XEDIT data set to allow editing of the default values file. Specifically, the default values file contains any one of the following items, for example, that can be edited: administrative data, machine types, cable print macros, device print macros, machine print macros, device types, wire gauges, wire colors, CADAM, addresses, connector types, connector strain relief types, connector size and connector pin designations.

If the authorization test 410 is negative (i.e., the user 402 or 404 is not authorized to make the changes that were requested), a message is generated 412 apprising the user of that fact. Authorization tests 410 are category level 4 authorizations only and are checked immediately. Category levels of authorization are hereinbelow discussed in greater detail. The message 412 is forwarded to the user 402 or 404 immediately by the WIRELIST EXEC 406. If, however, the modifications requested by the user 402 or 404 are authorized 410, WIREADMN EXEC and WIRELIST EXEC 406 forward such requests by means of a request file 414 to a disconnected user ID that runs a main EXEC 416 (hereinafter referred to as the host 416), where the request file 414 is processed.

The request 414 is sent to a hot reader 420, so called because the hot reader 420 awaits any activity by the main EXEC 416 and is, in effect, on call during execution of the main EXEC 416. The main EXEC 416 determines the sender of the request file 414 by inspecting a tag on the request file that has been read by the hot reader 420. The task of determining the requestor 404 or designer 402 is accomplished at reference numeral 422. The request file 414 is read from the hot reader 420 at step 424 and placed on the B scratch disk 448.

Data now on the B scratch disk 448, representing the request file 414, is analyzed to determine its category and subcategory 430. Depending upon the aforementioned category and subcategory, the system 416 next determines what level of authorization is required to perform the requested task.

There are four levels of authorization in WIRELIST 400 represented by categories of decreasing privilege, from one to four. The first and highest level of authorization corresponds to category one, wherein the expert system programmer 403 can stop the main EXEC 416 from execution. The expert system programmer 403 can stop the main EXEC 416 when he desires to modify the main EXEC 416. The expert system programmer 403 would normally make changes to the main EXEC 416 in order to improve system operations, enhance the program, correct errors or delete superfluous functions therefrom.

Authorization level two, corresponding to category two, is required by the expert system programmer or owner 403 to add a new file to a WIRELIST disk or to replace or rename an existing WIRELIST file. In this way, data lists can be updated by the main EXEC 416 without suspending or terminating operation thereof.

Authorization level three, corresponding to category three, allows the owner of the system 403 to change the name of the owner of a device or cable. Moreover, the owner 403 having authorization level three can delete or copy a device or cable. He can also rename a device or a connector on a device globally, perform remote checking of a device or cable or combine one device or cable with another.

Authorization level four, corresponding to category four, is required by a user 402, as hereinabove mentioned, in order to change a cable part number or EC number, to send a cable to CADAM, to update a device, to update a cable and/or a list of authorized users of the cable, to print a report on a device, a cable or a machine, or to transmit a list of devices or cables to another machine.

Having made a determination as to the category and subcategory and level of authorization required to perform the requested task, the main EXEC 416 now determines whether the requestor is authorized to do so, step 432. The system 416 not only determines whether the requestor is authorized to use WIRELIST 400, but also whether the requestor is authorized to perform the requested task, step 432. If the system determines that the individual 402, 403 or 404 who generated the request file 414 did not have the appropriate authorization level to do so, then a message is sent to the requestor, step 438. An appropriate message 438 is thence sent by means of the authority error messages file 412 to the requestor 402, 403 or 404.

If, however, the request was valid, the system 416 generates a success message 439 and thence sends it to the user 402, 403 or 404. The requested task is then performed, step 436, by the system 416, from which control is passed back to the hot reader 420.

The main EXEC 416 can access databases shown generally at reference numeral 440. The main EXEC 416 is stored on the A0 disk, shown as the main program database 441. It also includes all XEDIT databases callable by the main EXEC 416. Database 442 is an authorization file associated with categories one and two and some of the data relating to authorization level three. The remaining data relating to authorization level three and all of authorization level four is stored in the plan of record 16 and cable descriptions 18, as identified by reference numeral 418 in FIG. 4.

The default values file 444 stores the values hereinabove listed with respect to the WIREDFVL XEDIT data sets.

WIRELIST EXEC and WIREADMN EXEC are stored in database 446, which has a filemode of A1, indicating that these EXECs can be accessed by authorized users 402, 403 and 404.

The designer 402 has the ability to run WIREADMN EXEC 406 from his terminal. The WIREADMN EXEC 406 program allows the owner/designer 402 to set up authorization levels for other designers and requestors 404.

Both the requestor 404 and the designer 402, belonging to separate classes, can specify cable part numbers and EC part numbers. This activity is performed, however, by the requestor and by the designer 402 using a part number.

The requestor 404 is not permitted, however, to change the plan of record 16, although the designer 402 is. The requesting user group and the designer group are both permitted to display the information in the plan of record 16. Similarly, certain information can be entered and changed by a member of the requestor 404 class that cannot be changed by a member of the designer 402 class.

Information required for each model in a product series must be changed or added to proper files 440 prior to using WIRELIST 400. These values include, but are not limited to, the names, USERIDs and available options of each user 402 and 404; the disk addresses of the various USERIDs; the information in the default values file 444 to identify the correct acceptable entries for the plan of record 16 and cable descriptions 18.

Rules are defined as: hard coded and user input. Hard coded rules are built into the checking routines for certain functions. These are defined as rules that do not change. The user 402 or 404 defines a variable set of rules whose parameters are generally stored in the default values file 444, a sample of which is described hereinbelow.

WIRELIST 400 is a menu driven program having fields requiring data by a user. Blank fields are not permitted unless blank data is valid data.

Some fields on the entry screens are free form. These fields will accept any data entered. The program 400 is not capable of checking them for accuracy, but the fields cannot be left blank.

Certain fields are not pertinent to every connector style or wire type, so blank fields are forced. For example, a wire may be entered with the purpose of SPARE. By definition, this wire has a number, runs between two connectors and is not terminated. This causes the program to accept a blank field for the connector position on the cable entry screen. If the user 402 or 404 enters information, the checking routine forces its removal before allowing the data to be saved.

WIRELIST 400 does not accept incomplete data, so a requestor 404 must input the point to point information, the wire styles to be used, colors and sizes. The cable requestor 404, who is recognized by the program 400 as the owner of a particular description, is also expected to know the terminal gender with which the wire is terminated and whether the circuit requires terminals of precious metal such as gold.

The cable designer 402 can review all cable designs forwarded from a cable requestor 404. While the requestor 404 may enter information acceptable within the rules established by the default values file 444, the particular application may require something different. Upon review, the designer 402, if authorized by the cable owner 402, can make the necessary changes.

Once a cable description 418 is completed and reviewed by the cable designer 402, the data is transmitted to the MDA system 15. During this step, WIRELIST 400 merges device/connector data with wire information and creates a character string 240 characters long. This information is enveloped by special job control language (JCL) to allow the MDA system 15 to receive and file the data automatically.

In the preferred embodiment, the initial installation for development of this system requires the use of four mini disks 440 on which WIRELIST 400 is loaded:

A Disk: contains the programs, macros and information files necessary to run WIRELIST 400. It requires two cylinders of IBM Model 3380 disk space or the equivalent.

WIRELIST EXEC 446, WIREADMN EXEC 446, default values 444 and certain authority files 442 have a filemode of A1 whereas all system files 441 have a filemode of A0. p1 B Disk: a scratch disk 448 used as work space for the host program 416, requiring two cylinders of space.

D and E Disks: initial data disks, containing the digital plan of record files 418, cable descriptions 418 and authorization routines 418. Also contained on the data disks 440 is the default values file 444. Each of these disks 440 typically uses about five cylinders of disk space. More disks 418 can be added, if required, and appropriately labelled, each by a letter, to distinguish them from one another and from all other disks hereinabove described.

Subsequent installations require at least three disks (A, B and D) and one additional disk for each additional product to be designed.

Referring now also to FIG. 5, there are shown sample acceptable default values for some of the entry fields that are programmed to contain specific but variable information. This file is user maintained, facilitating update, addition and deletion of certain rules.

Some examples of information contained in the default values file 444 are device abbreviations, wire colors, wire size (AWG), connector abbreviations, strain relief types, and connector mating information. These items of information ensure that only information corresponding to predetermined requirements is used.

Other values that must be initialized include the information regarding the MDA system 15 to which cable files 18 will be sent. The particular address, the netid and other pertinent information for the system being used must be entered. The address to which the cable descriptions 18 will be sent must be entered into the default values file 444. The unique requirements of the JCL of the receiving system 15 must be entered into the CABLETOP JCL and CABLEBOT JCL files located on the B disk 448 of the host system logon 416.

To achieve broad based information availability, all the data files and the programs can be accessed and utilized by the user community 402, 403 and 404 by gaining read only access to the mini disks 440 where they reside. These disks 440 are password controlled. This provides a first level of security. Only designated people can view the information contained on the disks 440. Such people can access the information, copy it to their own disks if necessary and print or transmit it if desired. But they cannot change it.

Since users are given read only access to the data through program usage, another method is required to allow them to create and change data. A hot reader 420 is a function within the VM operating system. It includes an auto-receive routine that allows the program 416 to update and add data files 440 by means of sending request files 414 to the host system 416. Herein lies another level of security. A person with read only access to the disk 440 and the authority to make changes does so through the hot reader 420.

In addition, authority can be given to run different functions of WIRELIST 400. This is the third level of control. The different authority levels include: link access, creating devices, creating cables, assigning part numbers and engineering change (EC) level numbers and transmissions to the MDA system 15. Once a user 402 or 404 has authority to use the WIRELIST EXEC 406, the work is completed in the user's own workspace. However to make this change permanent it must be transmitted to disk 440.

WIRELIST 400 is capable of handling a large variety of cable designs, both in singular and in multiple styles and is capable of handling a mixture of wire AWGs and types in a cable assembly. The program 400 can differentiate between discrete wires, twisted pairs, coaxial, jacketed, shielded or ribbon cables. If the desired design has mixtures of these wire types in a cable, they can be handled, too.

The only limitations in WIRELIST 400 for connectors is related to which connector family or which connector style is desired. Each connector style has a unique seven character one word name or acronym assigned to it. Each style must be included in the default values file 444 in two places: first, it must be entered for an acceptable connector type; second, a series of parameters must be entered for the checking routines to assure proper data entry.

To create a program that works for all combinations of connectors and devices, certain assumptions and rules about naming conventions are made. All naming convention in all machines follows standard syntax: device, number, connector, pin. For example, the first power supply in the first frame of a product is ordinarily known as PS 101, where PS represents the device (power supply) abbreviation and 101 represents the number of the device. A wire going to power supply number 101, connector five, pin position seven is identified as: PS 101 J05 07.

For terminals, a barrier strip terminal block would ordinarily have RLNG or FLSPADE terminals on the wires that connect thereto. In this case, the system would expect the user to enter one of those values for the connector style.

Throughout WIRELIST 400, each display screen, not shown, follows a basic pattern. The instructions are displayed across the top of the screen. Messages are displayed, as needed, across the bottom of the screen. The bottom of the screen also displays the functions that will be performed by program function (PF) keys for that screen.

The user 402 or 404 runs the program 400 by pressing a predefined PF key. All portions of the program 400 have an option connected thereto 406 to access an on-line HELP section, not shown, to describe in more detail what is expected of the user 402 or 404.

Throughout the data entry process the user 402 or 404 can press the ENTER key at his terminal, not shown, at any time to cause the checking routines to begin. These routines check the data entered and return corrective action messages by means of lines 405 or 407. The checking routines then move the cursor, not shown, to the next field or to the next menu.

Once a user 402 or 404 has started WIRELIST 400, the main menu capabilities are displayed on the screen, as hereinafter described.

1. Plan of Record

To design cables using WIRELIST 400, the digital plan of record 418 must first be initialized for each product by using the host program 416. Similarly, device files 418 are created in the plan of record 418. The user 402 or 404 must identify the product to be worked on by name at the beginning of each session.

A screen displays the devices in the plan of record 418. The user 402 or 404 can add, delete or change devices when suitably authorized. Fields in the plan of record 418 are described as follows.

The device type is an abbreviation or acronym of up to three characters for the type of device to which cables are connected. When a new device is created, the entry into this field is checked against the list of acceptable values in the default values file 444.

The device number field is a three character free form field.

The last update field displays the date of the last alteration saved on the disk 418.

The device description field is a free form field of 50 characters that allows the user 402 or 404 to enter a general description about the device and its purpose.

The connector number field is a three character entry that may be alphanumeric. Each connector on the device is identified by the information entered into this field.

The connector type field is a seven character field which contains the style or trade name designation of the type of connector. The information entered into this field is checked against acceptable values of connector types in the default values file 444.

The gender field contains the one character gender of the connector: male (M), female (F) or neuter (N) (e.g., serpentine connectors).

The connector strain relief type field is nine characters and may be NONE. The information entered into this field is checked against acceptable values of connector types in the default values file 444.

The number of positions field represents the number of available positions, up to three characters, on the connector and can be entered indirectly as described below.

Some connector styles, such as ELSI connectors, have alphanumeric pin designations. For these connector styles, the user enters the number of the last connector position (e.g., D13) and the program 416 uses information in the default values file 444 to compute the number of positions available for proper cable hardware part number selection.

The connector size field represents the size of a connector, up to six characters, and can be used for size type information for certain connector styles. This field can be used for terminal size if the cable has terminals that are used as connectors.

The connector current field is three characters and is required to define certain power connectors completely.

A scan function can display all data relating to the current device file of the plan of record 418.

Later, when a cable description 418 is being created or changed, an entry into a data field may not match an acceptable value in the default values file 444. The program 400 displays all possible correct choices and instructs the user 402 or 404 to choose one of them.

At any time, the user 402 or 404 may wish to page back and forth (scroll) between different connectors created. An information message is displayed when the first and last created connector is reached and a scroll button is pressed again.

2. Changing/Creating a Cable Description

WIRELIST EXEC 406 allows a user 402 or 404 to create or change a cable description by selecting an appropriate option on the main menu screen.

Having created the digital plan of record 418 by building all the device files, requestors 404 and designors 402 may now create similar cable files that contain the cable description 418. These cable files 418 are created in a similar fashion to that used to create the device files.

The selection screen has the cable list, in four columns, containing information about each cable that has been created. The first column contains the part number information, the second contains the EC level, the third contains the number of wires that are in the cable file and the last contains a short description on the purpose of the cable.

To create a new cable, a display provides two entry blanks: "Part Number:" and "EC Number:". Up to seven characters can be entered for the part number and the EC level.

These fields are free form since the person creating the cable file may not always be the person who assigns the part number and EC level to the cable. For example, part number and EC information may be entered by an electrical engineer in a power design group. The actual part number and EC level, however, will be provided by a cable designer who releases the cable to manufacturing. Similarly, cable designors have the ability to rename the file for the purpose of performing engineering changes to the assembly when necessary. This is done by using the WIRELIST EXEC 406 to rename the cable description 418. By renaming the existing data file, the information need not be re-entered. Only the affected portions need be changed. If that is the case, the person entering this information should enter generic information when creating the file. This can later be changed by the proper designer 402 by utilizing the Update Part Number/EC Number option in the WIRELIST EXEC 406.

Upon successfully entering descriptive data into the part number/EC blanks, the cable entry screen appears, which screen contains all relevant wire related fields.

A scanning function can be utilized to scan a cable file 418. This function displays all the information about a wire or about the list of wires. From this screen, the user 402 or 404 can check information for accuracy, select an individual wire for change or scan the entire file 418 for reference.

All of the fields in the cable description 418 are shown in Table I.

TABLE I

| Fields of the Cable Description | | |
|---|---|---|
| Variable | Field Length | Description |
| PPN | 7 characters | cable part number |
| PEC | 7 characters | cable engineering change |
| PDESC | 38 characters | cable purpose |
| PHOLEF | 6 characters | FROM size information |
| PHOLET | 6 characters | TO size information |
| PWIRE# | 4 characters | wire number |
| PPURPOSE | 20 characters | wire purpose |
| PBUNDLE# | 2 characters | bundle number |
| PDEVICEF | 6 characters | FROM device type |
| PDEVIC#F | 3 characters | FROM device number |
| PDEVPOSF | 3 characters | FROM device position |
| PDEVPINF | 3 characters | FROM device pin |
| PTGNDRF | 1 character | FROM terminal gender |
| PMETALFF | 1 character | FROM precious metal flag |
| PSTYLEF | 7 characters | FROM conn/term style |
| PCGNDRF | 1 character | FROM connector gender |
| PINSAVEF | 2 digit number | FROM connector pins available |
| PSRSTYLF | 9 characters | FROM strain relief style |
| PAMPRATF | 3 digit number | FROM connector amp rating |
| PDEVICET | 6 characters | TO device type |
| PDEVIC#T | 3 characters | TO device number |
| PDEVPOST | 3 characters | TO device position |
| PDEVPINT | 3 characters | TO device pin |
| PTGNDRT | 1 character | TO terminal gender |
| PMETALFT | 1 character | TO precious metal flag |
| PSTYLET | 7 characters | TO conn/term style |
| PCGNDRT | 1 character | TO connector gender |
| PINSAVET | 2 digit number | TO connector pins available |
| PSRSTYLT | 9 characters | TO strain relief style |
| PAMPRATT | 3 digit number | TO connector amp rating |
| PWIRESZ | 2 digit number | wire size |
| PWIRECOL | 10 characters | wire color |
| PTEMPRAT | 3 digit number | temperature rating |
| PVOLTRAT | 4 digit number | voltage rating |
| PWIRTYPE | 12 characters | wire type |
| PSHIELDS | 1 character | shield status |
| PWIREL | 4 digit number | wire length |

To create the cable one wire (or pair) at a time, the user 402 or 404 must enter a brief description of the purpose of the cable in the appropriate field in Table I. This information is displayed on the cable listing screen.

The wire number field allows the user 402 or 404 to enter the number of a wire to be searched, added or changed. When creating a new cable this is typically number 1. After this initiation, while creating a cable the user may enter new wires without returning to this area simply by pressing a PF key for a new wire. This number automatically increments by one.

The purpose of the wire is entered in the wire purpose field. An example is AC distribution. This field helps create schematic diagrams, used in printed reports, as a tracking and checking tool and for general information. This field is checked for acceptable values in the default values file 444.

Two special wire purposes are SPARE and UNUSED. The program 400 is coded for each. For SPARE wires, the program 400 expects a TO and FROM connector but not a pin position. This is done anticipating the wire will be included in the body of the cable, but not terminated. When the user 402 or 404 enters UNUSED, the program 400 does not accept TO/FROM data.

The bundle number field designates more than one conductor in a single bulk wire part number. For example, if this cable were for AC distribution and the designer 402 wanted to use a three conductor, jacketed cable, a value would be inserted in this field, such as 01.

This indicates to the MDA SELECTOR program (hereinbelow described), when it accesses the cable hardware database multi-conductor cable.

The cursor next moves to the first TO field, and the wire number area changes to a four digit field by adding leading zeros to the information entered. This number also appears to the left of the TO line.

The TO/FROM wire information is entered on the next two lines. If there is a twisted pair, TO/FROM information can be entered for the black lead of the pair on the next two lines or the program 400 can return to this area later.

After all the TO/FROM information for the wire (pair) has been entered, the following information to allow for the automatic selection of the bulk wire part number from the cable hardware database must be provided by the user 402 or 404: AWG, the size of the wire; color, the color of the insulation; temp, the temperature rating of the wire information; and volt, the voltage rating of the insulation. The AWG and color fields are checked for acceptable values in the default values file 444.

A display line, not shown, then appears to describe the type of wire being used. This display line does not have to be completed for discrete or hook-up wires. The values will default to N for no. When using any one or combination of these fields, the proper blank must have a Y entered for yes, so the proper wire part number (i.e., jacketed, shielded or twisted pair) can be selected.

If the user 402 or 404 enters a Y in the twisted pair field but had not earlier filled in the second area of TO/FROM data, the program 400 moves there after adding the wire number to the left of that field with a "T" prefix. A message instructs the user 402 or 404 to enter the second set of TO/FROM information for the "T" wire.

If the user 402 or 404 enters a Y for either the ribbon or jacketed field, the program 400 verifies that a value has been entered for the bundle number.

The series of blanks in the TO Information fields requests information described in the aforementioned Table I about the connector at which the wire will terminate. The blank fields are called the device, device number, connector number and the position number for a connector. The fields also include the gender terminal and whether this terminal comprises precious metal.

FROM Information is the same sort of information as TO Information, dealing with the other end of the same wire. The TO end and the FROM end is defined by the user 402 or 404.

The cable entry screen or panel can also be used for modification of an existing wire in a cable description 418.

All cables are created or changed this way. Preparation of a cable description is thereby standardized for all users 402 or 404. The entire wiring schematic of the product is described in digital form. These cable files 418, when taken collectively with the device files, represent all the wiring that will be installed in the product.

With respect to the aforementioned renaming procedure, once the fields have been completed for renaming the cable assembly, a cable assembly selection screen, not shown, is displayed, informing the user 402 or 404 that the selected assembly will be renamed.

3. Transmitting a Cable Description

Transmission of the cable description 418 within WIRELIST 400 to the MDA system 15 proceeds as follows. A PF key is pressed to prepare for transmission. The cable file 418 is selected from the list of cables by moving the cursor, not shown, to the desired cable and pressing a PF key. This inserts an S in front of the selected cable on the menu screen and prompts the user 402 for a password to be entered twice. The next screen asks the user 402 to choose a destination for the data set. The previous screen is re-displayed with a message confirming that the cable description 418 has been sent.

Typically, an address exists for the MDA system 15. The program 400 moves to the next screen after a cable file 418 is chosen.

Whenever a file is transmitted by WIRELIST 400 to the MDA system 15, a record is made in a disk NETLOG file, not shown. This is done to help track user activity and to help correct any operational problems that might arise.

CADAM.TEST1.INPUT is a data set on the MDA system 15 for which RACF authorization is required. This is a temporary data set used in the automatic receive step that results in a cable description 418 being added to the CADAM.ACD.INPUT data set as a requirement of RACF. The user is granted ALTER authorization to that data set by a system administrator of the MDA system 15.

SELECTOR CLIST and SELECTOR Program

Figure 6:
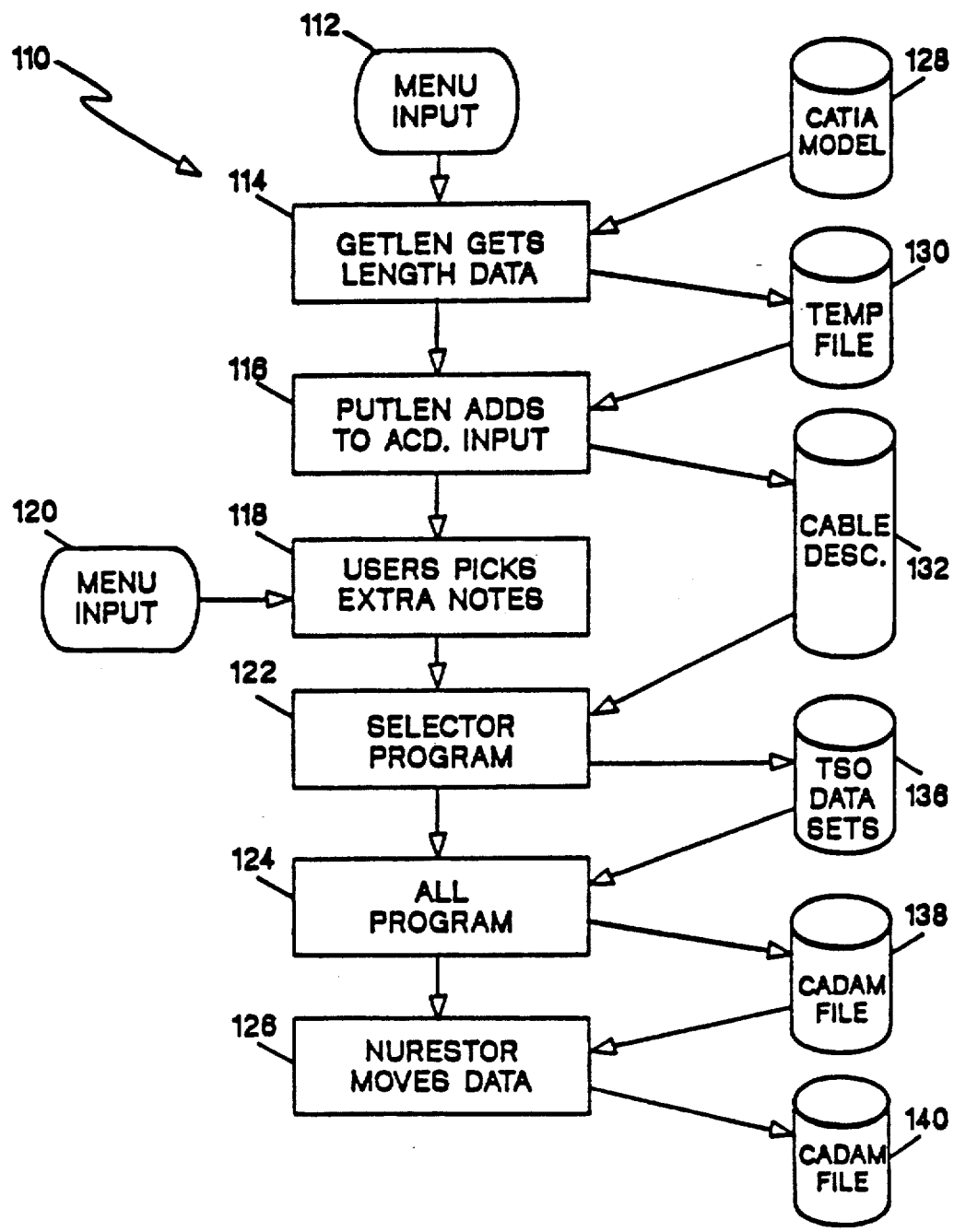
FIG. 6 is a block diagram of the SELECTOR CLIST.

Referring now also to FIG. 6 there is shown a flow diagram for SELECTOR CLIST 110, which itself executes a number of programs and requires input by the user 402 (FIG. 4). The CLIST 110 to run the programs of the preferred embodiment resides in a partitioned data set called CADAM.MENUS.CLIST as member ACD. This CLIST is triggered by a menu screen that resides in CADAM.MENUS.ISPPLIB as member ACD. Users 402 must be previously connected to the ACD group of data sets before they can run the CLIST 110 successfully. Users 402 must also be granted access to libraries that have the aforementioned program.

In FIG. 6, rectangular boxes represent system programs; screen-shaped boxes represent user input areas; and cylinders indicate data being accessed or created and saved.

In menu input 112, the user 402 is asked for three items of data. The first is the part number of the cable. The second is the CATIA model name in which the geometry is stored 128. That model name 128 is again used in naming the CADAM model 140 which contains the results of this CLIST 110. Lastly, the user 402 enters the personal CADAM subgroup on the menu input 112.

CATIA provides the user 402 with the capability of assigning 80-character model names. The preferred embodiment, however, does not use that many. In fact, SELECTOR CLIST 110 accepts only 16, a restriction of the CADAM IUE program. CADAM allows 20 characters, so the CADAM naming conventions are used herein for the first 16 characters when naming CATIA models 128. In contrast, CADAM models 138 are named by SELECTOR CLIST 110 using the part number from the member name Pnnnnnnn only.

SELECTOR CLIST 110 is designed to complete the cable description 132 before searching for cable hardware part numbers. Completion includes adding the length of each wire to the partitioned data set member indicated on the first menu screen 112 of the CLIST 110. To complete the cable description 132, the CLIST 110 includes two software programs called GETLEN 114 and PUTLEN 116 that get the length data from CATIA 128 and put the length data into the correct member of the data set 'CADAM.ACD.INPUT' 132 respectively.

GETLEN 114 requires the use of a partitioned data set named CADAM.WIRE.LENGTH.DATA 130 with member DEVELOP in which to store the length of the wires temporarily. The data set description is FIXED BLOCK with LRECL of 10 and always resides on a single DASD track.

GETLEN 114 is in data set 'CADAM.ACD.JOBLIB'. The source is in 'CATIA.WIRE.SOURCE' in member CABLNGTH. The source is preferably written in FORTRAN because the CATIA GI (Geometry Interface), used to access the CATIA model 128, is written in FORTRAN. The JCL to compile CABLNGTH is in data set 'CATIA.WIRE.JCL', member COMPILE. The GETLEN load module 114 is stored in data set 'CATIA.WIRE.LOAD' and a working copy is made in 'CADAM.ACD.JOBLIB' with renamed member GETLEN.

GETLEN 114 uses the Geometry Interface to extract the geometry for each wire from which is computed its exact length, because the length of each wire is not directly supplied by the GI. The GI supplies only the geometric description of the wire. In most cases the wire is actually a collection of other geometry, including CATIA lines, splines and wires. The GI information includes the order of the polynomial for each piece of the wire. GETLEN 114 computes the length for each section of the wire and accumulates the total wire length.

Length computations are straight forward as the polynomial coefficients are given for each of the three coordinate axes. All computations are parametric and the number of fragments between points is provided. When the polynomial is first order, the section of the wire is, of course, a straight line with one fragment. When the order is three, the calculation is a parametric cubic spline. CATIA supports polynomials up to the fifteenth order, analogously.

The second CLIST program, PUTLEN 116, extracts length data and adds it to 'CADAM.ACD.INPUT' 132 in the member specified. PUTLEN 116 is a member in data set 'CADAM.ACD.JOBLIB'. The source is in data set 'CATIA.WIRE.SOURCE' member ADDLNGTH. Compilation and link editing is performed using the foreground utilities for VS FORTRAN. The resultant load module in 'CATIA.WIRE.LOAD' is copied and renamed into data set 'CADAM.ACD.JOBLIB'.

PUTLEN 116 is written in VS FORTRAN to manipulate characters in a way not easily accomplished by FORTRAN. This is the reason GETLEN 114 and PUTLEN 116 are not combined into one program.

PUTLEN 116 does not contain extensive checking for contradictory information in the CATIA model 128 when compared to 'CADAM.ACD.INPUT' data 132. The only rudimentary check is to ensure that there is a wire name in the CATIA model 128 that matches the wire name in the administrative description of the cable, ACD.INPUT 132. Extra curves, incorrectly named wires or missing curves result in the same error message. The SELECTOR CLIST 110 continues to run but the length data will be missing from the CADAM model 138 and 140.

The CADAM.SELECTIV.NOTES, not shown, is a sequential data set which contains notes to be added to a CADAM model which is to become part of the cable assembly drawing 138 and 140. These notes are moved to CADAM 138 only if the user 402 flags them by entering a letter Y in the selection (menu) area 120 when running SELECTOR.CLIST 110. The notes are placed on the drawing 138 in the order selected. This allows the user 402 to create a specific arrangement of notes if required. This data set has specific length parameters and is designed to conform with the size of the Note View of the final CADAM drawing 140. Consistency is achieved across all cable drawings 140. All notes on all models 140 have the same wording, the same sequence and all are spelled correctly.

Prior to running CLIST 110, the user 402 can use the SPF Edit function to add new notes by editing the data set.

Upon completion of the selective note process, the user 402 presses a PF key to execute the program in the CLIST 110. This program is SELECTOR 122 and is hereinbelow described in greater detail. Again, a series of screen messages is displayed describing the process of the program. At the end of these messages three asterisks, ***, appear which prompts the user 402 to press the ENTER key to execute the next program, ALL 124.

The ALL program 124 is a CADAM imaged program created using the CADAM IUE and stored as member name ALL in library 'CADAM.CABLE.IMGLIB'. Creation of CADAM IMGLIBs is described in CADAM manuals. Execution within this step 124 of the SELECTOR CLIST 110 starts as batch CADAM but immediately transfers control to the program ALL 124. When ALL 124 ends, control passes back to the batch CADAM program CADMONTR, which ends the step 124 and passes control back to the CLIST 110.

The source for ALL 124 is in data set 'CADAM.CABLE.SOURCE'. The main program is the member named ALL; the other member, BAR, is called by the main program 124. The JCL to compile and link ALL is in data set 'CADAM.CABLE JCL(COMPALL)'.

ALL 124 first opens the special outline drawing, not shown, named 'CABLE OUTLINE MODEL'. Then sequentially ALL 124 adds five types of administrative data to the CADAM drawing 138. Then the model 138 is filed in an IN subgroup using the part number from menu input 112 as the model name.

CADAM database management is performed by group, each group capable of comprising a large number of subgroups or USERIDs. Most subgroups are password protected. Direct IUE access is impossible in those cases. Since ALL 124 uses the IUE, two subgroups without passwords named IN and CATIA, neither shown, are required. Data passes from CATIA to IN using the IUE and to the user's subgroup, with or without passwords, using the utility NURESTOR 126.

A fully operational interactive CADAM system, not shown, and also the non-interactive NURESTOR utility 126 is required. The CADAM model named 'CABLE OUTLINE MODEL' is also required to be in the CATIA subgroup. This model includes an added AA view and an NV view. In addition, specific cable data that applies to all cables is added. If the user 402 requires additional items that do not change, such items could be made and filed in 'CABLE OUTLINE MODEL'.

NURESTOR 126 is a CADAM utility whose usage is described in CADAM manuals. For purposes of the preferred embodiment, NURESTOR 126 loads, unloads and deletes CADAM models. Specifically, it unloads the CADAM model 138, most recently created from the IN subgroup, loads that model into the user's password protected subgroup and deletes the copy 138 in the IN subgroup.

Informational, status and error messages appear throughout the execution of the CLIST 110.

The SELECTOR Program

The SELECTOR program 122 is a knowledge based system which makes the similar logical, sequential decisions that a designer would make while manually selecting cable hardware part numbers.

SELECTOR 122 combines the completed cable description with the user maintained database to produce most of the administrative data required for CADAM drawings 140. The completed cable description 132 is a physical cable description in text form. The text form as herein used is in EBCDIC characters.

Figure 7:
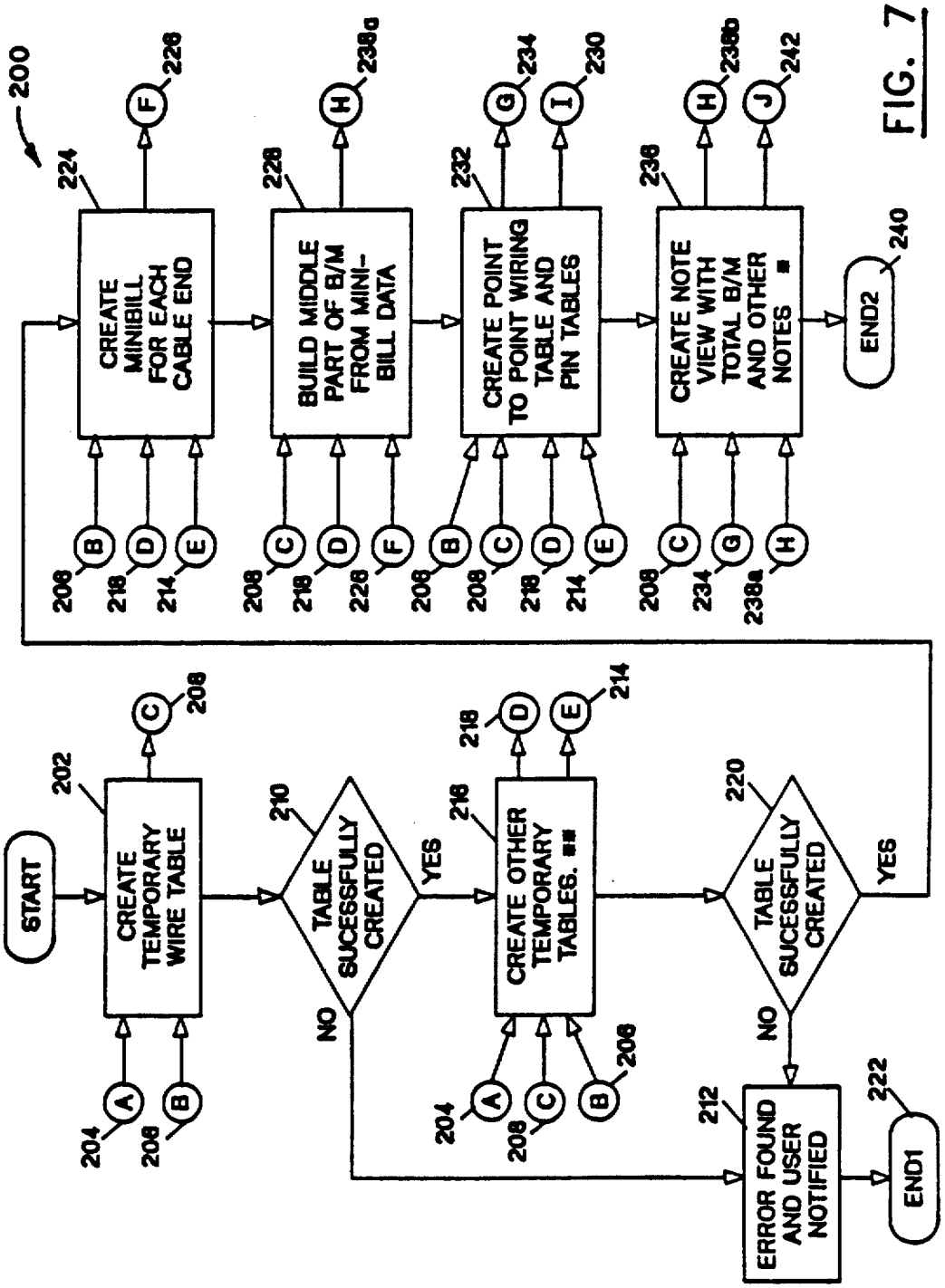
FIG. 7 is a flow chart of the SELECTOR program with tabular I/O data set descriptions relating thereto.

An overview and detailed description of the SELECTOR I/O data sets are shown in FIG. 7. All boxes in this FIGURE represent steps in software and circled letters represent data sets or collections thereof. An input to SELECTOR 200 is a member of the partitioned data set named 'CADAM.ACD.INPUT' 204. The member name is the letter P followed by the part number of the cable being described in the member (Pnnnnnnn). The input member name is herein referred to as Pnnnnnnn 204. Another input database comprises 13 user maintained tables in a part number database 206. Five output tables are generated by the program 200 and written to partitioned data sets 226, 234, 230, 238b, 242 with the member name being the same as that of the input data set. The five outputs are called minibill 226, bill of materials 238b, point to point wiring table 234, special and selective notes 242 and pin tables 230.

The results of SELECTOR 200, which are temporarily output into the hereinbelow described five output data sets, are later loaded into a CADAM model 138 and filed in a CADAM group and subgroup.

The five output tables are named:

| | | |
|---|---|---|
| 226. | 'CADAM.MINIBILL.DATA(Pnnnnnnn)' | |
| 238b. | 'CADAM.BOM.DATA(Pnnnnnnn)' | |
| 234. | 'CADAM.WIREPTPT.DATA(Pnnnnnnn)' | |
| 230. | 'CADAM.CADTABLC.DATA(Pnnnnnnn)' | (for CPC data) |
| | 'CADAM.CADTABLE.DATA(Pnnnnnnn)' | (for ELSI data) |
| | 'CADAM.CADTABLM.DATA (Pnnnnnnn)' | (for MNL data) |
| 242. | 'CADAM.NOTES.DATA(Pnnnnnnn)' | |

If SELECTOR 200 generates any error messages, the output data sets are not generated and consequently are not written to CADAM. The generated messages are written into a message data set.

SELECTOR 200 is the most important part of the SELECTOR CLIST 110 (FIG. 6). The first input data set is the completed cable description 204. Prior to executing PUTLEN 116, the length field shown in Table I, supra, was blank.

The other 13 data tables 206 used throughout the program 200 provide part numbers and information used in building the minibill 226 and the bill of materials 238b output. They are all sequential data sets.

These 13 tables 206 have a high level qualifier name of CADAM and a low level qualifier name of LIST, with the middle qualifier name being unique for each. That is, a data set is identified 'CADAM.XXXXXXXX.LIST' where XXXXXXXX is the unique data set name of the table. An example is the TERMINAL table, the complete name of which is CADAM.TERMINAL.LIST'. These data sets are herein referred to as XXXXXXXX table.

There are three main tables 206: WIRE, TERMINAL and CONNECTR. These tables consist of fields which are either character or numeric in value. Character fields are left justified padded with blanks. Numeric fields are right justified, padded with blanks and include both integer and fixed decimal fields. The attributes apply also to the rest of the tables used by SELECTOR 200. Of the aforementioned 13 tables, the main three are shown is Tables II, III and IV. The remaining ten tables relate to specific connectors and terminals supported by the present embodiment.

The WIRE table has the fields shown in Table II.

TABLE II

| | WIRE Fields | |
|---|---|---|
| Variable | Field Length | Description |
| WPN | 7 characters | wire part number |
| WCOLOR | 10 characters | insulation color |
| WAWG | 2 digit integer | conductor wire size |
| WOD | fixed decimal x.zzz(in) | diameter with insulation |
| WVRMAX | 4 digit number (volts) | maximum voltage rating |
| W#CON | 2 digit number | number of conductors |
| WTEMPMAX | 3 digit number (cent) | maximum temp rating |
| WTYPE | 12 characters | wire type |
| WSHIELD | Y or N | shield status |
| WBOD | fixed decimal x.xxx(in) | bundle outside diameter |

The TERMINAL table has the fields shown in Table III.

TABLE III

| | TERMINAL Fields | |
|---|---|---|
| Variable | Field Length | Description |
| TPN | 7 characters | terminal part number |
| TSTYLE | 7 characters | terminal style |
| TAWGMIN | 2 digit integer | numerical minimum AWG |
| TAWGMAX | 2 digit integer | numerical maximum AWG |
| TODMIN | fixed decimal xx.zz(mm) | min. acceptable wire dia. |
| TODMAX | fixed decimal xx.zz(mm) | max. acceptable wire dia. |
| TGENDER | 1 character (M, F or N) | terminal gender |
| TMETALF | 1 character (Y or N) | precious metal flag |

The CONNECTR table has the fields shown in Table IV.

TABLE IV

| | CONNECTR Fields | |
|---|---|---|
| Variable | Field Length | Description |
| CPN | 7 characters | connector part number |
| CSTYLE | 7 characters | connector style |
| CPINSMAX | 2 digit integer | number of pins available |
| CGENDER | 1 character (M, F or N) | connector gender |
| CAMPMAX | 3 digit integer (amps) | maximum amperage rating |

The MNLSRPN table has the fields shown in Table V.

TABLE V

| | MNLSRPN Fields | |
|---|---|---|
| Variable | Field Length | Description |
| MSRCPN | 7 characters | connector part number |
| MSRPN | 7 characters | strain relief part number |
| MTYPE | 10 characters | strain relief type |

The MNLADAPT table has the fields shown in Table VI.

TABLE VI

| | MNLADAPT Fields | |
|---|---|---|
| Variable | Field Length | Description |
| MASRPN | 7 characters | strain relief part number |
| MAPN | 7 characters | adapter part number |

The MNLSCREW table has the fields shown in Table VII.

TABLE VII

| | MNLSCREW Fields | |
|---|---|---|
| Variable | Field Length | Description |
| MSAPN | 7 characters | strain relief part number |
| MSPN | 7 characters | screw part number |

The CPCRANGE table has the fields shown in Table VIII.

TABLE VIII

| | CPCRANGE Fields | |
|---|---|---|
| Variable | Field Length | Description |
| CPCRPN | 7 characters | connector part number |
| CPCRIPN | 7 characters | strain relief part number |
| CPCLR | 6 digit integer | mininum CMA rating |
| CPCHR | 6 digit integer | maximum CMA rating |

The ELSISRPN table has fields shown in Table IX.

TABLE IX

| | ELSISRPN Fields | |
|---|---|---|
| Variable | Field Length | Description |
| ESRCPN | 7 characters | connector part number |
| ETYPE | 7 characters | ELSI connector type |
| ESRPN | 7 characters | strain relief part number |
| ECLMP | 7 characters | clamp part number |
| ERVTS | 7 character | rivets part number |
| ECRDG | 7 character | card guide part number |

The SERPHDWR table has the fields shown in Table X.

TABLE X

| | SERPHDWR Fields | |
|---|---|---|
| Vaiable | Field Length | Description |
| SERPSTYL | 2 characters | SERP connector style |
| SERPCPN | 7 characters | extra connector part number |
| SERPSRPN | 7 characters | strain relief part number |
| SERPCLMP | 7 characters | clamp part number |
| SERPRVTS | 7 character | rivets part number |

The DSUBSRPN table has fields shown in Table XI.

TABLE XI

| | DSUBSRPN Fields | |
|---|---|---|
| Variable | Field Length | Description |
| DSRCPN | 7 characters | connector part number |
| DSRPN | 7 characters | strain relief part number |

TABLE XI-continued

| | DSUBSRPN Fields | |
|---|---|---|
| Variable | Field Length | Description |
| DSRTYPE | 2 characters | type of strain relief |

The DSUBSCRW table has fields shown in Table XII.

TABLE XII

| | DSUBSCRW Fields | |
|---|---|---|
| Variable | Field Length | Description |
| DSCPN | 7 characters | connector part number |
| DSSPN | 2 characters | screw part number |
| DSSIZE | 7 characters | size information |
| DSNSRT | 7 characters | insert part number |

The BERGSIZE table has the fields shown in Table XIII.

TABLE XIII

| | BERGSIZE Fields | |
|---|---|---|
| Variable | Field Length | Description |
| BERGCPN | 7 characters | connector part number |
| BERGSIZE | 6 characters | size information |

The SLPRNGSP table has fields shown in Table XIV.

TABLE XIV

| | SLPRNGSP Fields | |
|---|---|---|
| Variable | Field Length | Description |
| SRSTPN | 7 characters | terminal part number |
| SRSSIZE | 6 characters | size of hole |
| SRSTUBE | 7 characters | tubing size |

Numerous temporary work tables 208 and 218 are used throughout the program 200. Three of these tables and their record lengths are:

| | |
|---|---|
| CADAM.TWIRETAB.LIST | 52 |
| CADAM.WTERM.LIST | 28 |
| CADAM.WCONN.LIST | 28 |

The TWIRETAB table has the fields shown in Table XV.

TABLE XV

| | Temporary Wire Fields | |
|---|---|---|
| Variable | Field Length | Description |
| WBUND# | 2 characters | bundle number, if any |
| WBUNDPN | 7 characters | wire part number of bundle or of lead (if discrete) |
| WLENBUN | 4 characters | largest wire length |
| WAWGBUN | 2 characters | AWG of bundle or of lead |
| WCOLBUN | 10 characters | color of bundle or of lead |
| WTYPBUN | 12 characters | type of bundle or of lead |
| WSHLDBUN | 1 character | shield status of bundle |
| WISTLEAD | 4 characters | first lead of bundle |
| WBODBUN | 5 characters | bundle outside diameter |
| WODBUN | 5 characters | wire outside diameter |

The temporary TERMINAL table has the fields shown in Table XVI.

TABLE XVI

| | Temporary Terminal Fields | |
|---|---|---|
| Variable | Field Length | Description |
| TTPN | 7 characters | terminal part number |

TABLE XVI-continued

| | Temporary Terminal Fields | |
|---|---|---|
| Variable | Field Length | Description |
| TAWGMN | 2 digit integer | numerical minimum AWG |
| TAWGMXX | 2 digit integer | numerical maximum AWG |
| TMIND | fixed decimal xx.zz(mm) | min. acceptable wire diameter |
| TMAXD | fixed decimal xx.zz(mm) | max. acceptable wire diameter |
| TGNDR | 1 character (M, F, or N) | terminal gender |
| TPMF | 1 character (Y or N) | precious metal flag |
| TUPOS | 2 characters | unique positions used |
| TSPARE | 3 characters | future use |

The temporary CONNECTOR table has the fields shown in Table XVII.

TABLE XVII

| | Temporary Connector Fields | |
|---|---|---|
| variable | Field Length | Description |
| CCPN | 7 characters | connector part number |
| CPINS | 2 digit integer | number of pins available |
| CAMPS | 3 digit integer (amps) | maximum amperage rating |
| CTYPE | 3 characters | connector style |
| CSPARE | 6 characters | calculated CMA value |
| CSIZE | 6 characters | connector size information |

The output data generated by SELECTOR 200 is described as follows. These data sets and their record lengths are:

| 1. CADAM.MINIBILL.DATA | 28 |
|---|---|
| 2. CADAM.BOM.DATA | 52 |
| 3. CADAM.WIREPTPT.DATA | 88 |
| 4. CADAM.NOTES.DATA | 80 |
| 5. CADAM.CADTABLx.DATA | 80 | where x is M for MNL output, C for CPC output, E for ELSI output.

The minibill output table 226 has the fields shown in Table XVIII.

TABLE XVIII

| | Minibill Output Fields | |
|---|---|---|
| Variable | Field Length | Description |
| MINIPN | 7 characters | part number |
| MINICT | 4 characters | count for the part number |
| MINITYPE | 15 characters | description of part number |

The bill of materials (Part 2) table 238a has the fields shown in Table XIX.

TABLE XIX

| | Bill of Materials (PART 2) Fields | |
|---|---|---|
| Variable | Field Length | Description |
| BOMPN | 7 characters | part number |
| BOMCNT | 4 characters | count for the part number |
| BOMDESCR | 15 characters | description of part number |

The WIREPTPT table 234 has the fields shown in Table XX.

TABLE XX

| | WIREPTPT Fields | |
|---|---|---|
| Variable | Field Length | Description |
| WPNBUN | 7 characters | wire part number of bulk |
| WNUM | 2 characters | wire number |

TABLE XX-continued

| | WIREPTPT Fields | |
|---|---|---|
| Variable | Field Length | Description |
| WCOL | 10 characters | wire color |
| WDEVF | 3 characters | device from field |
| WDEV#F | 3 characters | device number from field |
| WDEVPOSF | 3 characters | device position from field |
| WDEVPINF | 3 characters | device pin from field |
| WTERMPNF | 7 characters | from terminal part number |
| WDEVT | 3 characters | device to field |
| WDEV#T | 3 characters | device number to field |
| WDEVPOST | 3 characters | device position to field |
| WDEVPINT | 3 characters | device pin to field |
| WTERMPNT | 7 characters | to terminal part number |
| WLENGTH | 4 characters | wire length in mm |

The CADTABLx data sets contain pin table data. When cables do not use connectors, these data sets are empty. Otherwise they use up to the 80 bytes allocated.

SELECTOR 200 writes error messages into a partitioned message data set named CADAM.MESSAGES.DATA with member names identified by the letter P followed by the part number. When errors occur, the SELECTOR CLIST 110 switches users to the SPF browse mode to review the problem list. A typical problem is that the tabular data 206 is incomplete and that the cable designer 402 must add data to the cable hardware database 206.

SELECTOR Logic

Referring still to FIG. 7, the first step 202 of SELECTOR 200 is to create a temporary wire table 208. The table 208 contains all the necessary wire information to be used by the remaining steps of SELECTOR 200. As inputs, two data sets are used: Pnnnnnnn 204 and the WIRE table 206.

The program 200 processes Pnnnnnnn 204 sequentially. If the purpose field of the entry is UNUSED, no entry is made for it in the temporary wire table 208. If the purpose is not UNUSED, the system 200 determines whether the entry is part of a bundle. Bundles must have an entry in the wire type field which cannot be 'twisted pair' or 'discrete'. The only valid types for bundles are:

'jktd tw pr'—jacketed twisted pair
fl wov tw pr'—flat woven twisted pair
fl rib tw pr'—flat ribbon twisted pair
'jacketed'—jacketed A T-wire is the black lead of a twisted pair of wires. T-wires are processed as individual wires. Coax wires are handled similarly to twisted pairs where an X-wire is the shield.

All leads in a bundle, except those with the purpose of UNUSED, are counted to calculate the number of leads. If the purpose of one of the leads is 'shielded', it must be marked with a 'Y' on the shield field. Then the number of conductors is one less than the number of leads; otherwise the number of conductors is the same as the number of leads.

The colors for the leads in a bundle can be a combination of black, white, red, green/yellow and any others under the MULTI category. If the entry is not part of a bundle, then the wire type can be 'discrete', 'twisted pair' or can be left blank. If the entry is 'twisted pair', then the number of leads is two and the wire cannot be shielded.

If any of these conditions are not met, an error message 212 specifies which error occurred.

Once all of the aforementioned conditions are verified, the WIRE table 206 is searched for a match based on the color, number of connectors, AWG size, temperature rating, voltage rating, shield and type fields. Once the match entry is found, the information is written in the temporary wire table 208. If a match is not found, an error message 212 specifies what type of wire is being sought. For example, 'WIRE NOT FOUND—#OC=1 0002 80 600 typ=discrete sz=28 col=grn/yel s=n' indicates that lead #0002 has an AWG size of 28, green/yellow color, a temperature rating of 80, a voltage rating of 600, a discrete type, with one conductor and not shielded.

If the temporary wire table 208 is empty after this step 202, a condition code is set and SELECTOR 200 ends, step 222, with an error message 212 specifying that there are no entries in the temporary wire table 208 and that the execution of the program 200 will not continue. If the table 208 is not empty, the program 200 continues with the second step 216, which builds the temporary terminal and connector tables 218.

The program 200 processes Pnnnnnnn 204 by device, not shown, using the FROM side first and then the TO side of each device. Entries with the purpose field of UNUSED are ignored.

For terminal styles other than RING, SLIP-ON and FLSPADE, the temporary terminal and connector tables 218 are based on the device, device number, device position and style. Device position is not considered for RING, SLIP-ON or FLSPADE.

Information is gathered for each entry in Pnnnnnnn 204 that matches the initial field chosen from Pnnnnnnn. The temporary wire table 208 is searched for the correct wire outside diameter (WOD) and bundle outside diameter (BOD) values for that entry. WOD and BOD values are the same for single leads. In a bundle, the BOD value is used only for the first lead; all other leads in the bundle are set to zero. This value is used later to calculate the total circular mil area (CMA) for the device.

Once all the values are gathered, the program proceeds to seek a match in the TERMINAL table 206 and then a match in the CONNECTR table 206.

Certain connector styles (e.g., ELSI, SERPE, SERPJ and SERPI) do not have terminals associated with them. Likewise, some terminal styles (e.g., SLIP-ON, RING and FLSPADE) do not have connectors associated with them. When the terminal has no connector, the terminal is processed as the connector.

The search for a terminal/wire match is based on style, wire size, terminal gender, terminal metal flag and WOD value found in tables 204, 206 and 208. If a match is found, the style is checked to see if it is RING, SLIP-ON or FLSPADE. If so, the mounting size information must be taken into consideration. An input table called SLPRNGSP 206 is searched until a match on terminal part number and size is found. An error message 212 is generated if a match is not found. For example, 'NO TERMINAL/SIZE MATCH-Ring TB 01 01 20 M Y 120×10' indicates a RING style terminal, device TB 01 01, with a wire AWG of 20, gender of M, metal flag of Y and a mounting size of 120×10. Ring and spade terminals have mounting sizes more typically specified as a #6 or #8 circular hole.

If a terminal match is found based on all search fields, an entry in the temporary TERMINAL table 218 is built and the entry is marked as used in the Pnnnnnnn 204. The program 200 continues looping through the rest of the Pnnnnnnn 204 seeking other matches on device, number, position, style, gender, metal flag, AWG and voltage. When found, the entries and the used pin table 230 are marked as used for those pins. At the end of the Pnnnnnnn 204, the number of pins used by that specific device is counted and put into the temporary TERMINAL table 218.

If a terminal/wire match is not found based on the aforementioned fields, an error message is generated, step 212, specifying the information used in the search. For example, 'NO TERMINAL/WIRE MATCH-Ring PS 101 A1 22 Yellow 0.096 F Y 250×30' indicates a Ring style terminal with a 0.096 WOD value, Y for metal flag, F for gender and a size of 250×30. PS 101 A1 is the device information and 22 Yellow 0.096 is the wire information.

The search for a connector is based on style, connector gender and connector pins maximum fields. If a match is found, the style is checked. If it is BERG, a match must also be made for the size information by accessing the BERGSIZE 206 table for a match on connector part number and size.

Once the match is found, the CMA value is calculated by squaring the BOD value of the associated wire. The entry is marked as used in the Pnnnnnnn 204 and the information is written in the temporary CONNECTOR table 218.

If a match is not found, an error message, step 212, is generated specifying the information used in the search. For example, 'NO CONNECTOR MATCH FOUND-MNL PS 101 A1 N 15 110×20' indicates an MNL style connector with 15 pins available, N for gender and a size of 110×20. PS 101 A1 is the device information.

If no errors have been found generating the temporary TERMINAL and CONNECTOR tables 218, the program 200 continues with the step 224, which builds the MINIBILL output table 226.

All connector entries and their associated hardware and terminals are built first. All terminal entries which do not have any connector associated with them are built next.

Processing starts first with the temporary CONNECTOR table 218. A header is built in the minibill 226 for each different device. Then the connector part number is taken from table 218 and the entry is added to the minibill 226 with a quantity of one and a description of 'connector'. Several styles of connectors also need additional hardware and are found through the use of tables 206 and 214. The list of available connector styles includes: CPC, MNL, BERG, ELSI, SERP and DSUBMIN. It should be understood that other connector styles can be added without exceeding the scope of the present invention.

SELECTOR 200 supports the Mate-N-Lok (MNL) family of connectors with 2, 3, 4, 6, 9, 12 and 15 pins and includes the three types of strain relief CLAMSHELL, RETAINER and SHROUD, as well as no strain relief. Consideration as to the gender of connectors is also applied in the selection of all other required cable hardware.

MNL connectors require a search for a strain relief in the MNLSRPN 206 table. The search is based on connector part number and strain relief type. If a match is found, a strain relief entry is added to the minibill 226. The count for the part number is one for a strain relief type of RETAINER and two for any other type of strain relief.

Strain relief types of RETAINER and CLAMSHELL require a search of the MNLADAPT table 206 for an adapter part number based on the strain relief part number. If a match is found and the connector gender is not male, an adapter entry is added to the minibill 226 with a part number count of two.

If the strain relief is CLAMSHELL, a screw part number must be located in the MNLSCREW table 206. The match is based on the strain relief part number. If found, a screw entry is added to the minibill 226 with a part number count of two.

SELECTOR 200 supports circular plastic connectors (CPC) from 3 to 63 pins and dynamically creates pin tables of reasonable size and shape based on the number of pins available. Also included are the strain relief hardware and the CMA calculation required to specify the appropriate strain relief. Acting on the specification indicated by SELECTOR 200 during CADAM drafting, the user 402 selects the appropriate CPC insert detail from the standard CADAM library and displays the insert orientation on the final CADAM drawing 33 (FIG. 1).

To find the correct strain relief part number for CPC connectors, the CMA value is calculated. The sum of all the CMA values for a device in the temporary CONNECTR table 218 becomes the total CMA value. The CPCRANGE table 206 is searched for a match based on the connector part number and a CMA value within the high and low ranges in the table 206. Once a match is found, the strain relief part number information is written in the minibill 226 and a strain relief note is added to the NOTES file 242. If a match is not found, an error message specifies incorrect range for the connector part number.

SELECTOR 200 supports four styles of extremely large scale integration (ELSI) connections. The abbreviations are: ELSIH, ELSIV3, ELSIV6 and ELSIT. These connectors are used in horizontal (H) sockets, in vertical (V) sockets in three high and six high boards and in top card connections (T). The required connector cards together with all strain relief part numbers and associated cable hardware part numbers are included.

For ELSI connectors, the ELSISPN table 206 must be searched for the rest of the associated hardware. The search is based on the connector part number and the type of ELSI connector (H, T, V3 or V6). Once the entry is found, the strain relief part number and the clamp part number information are added to the minibill 226, each with a part number count of one. Also, if an entry in the rivets field and the card guide field are found in table 206, part numbers are also added to the minibill 226, where rivets part numbers are added with a part number count of two and where the card guide part numbers are added with a part number count of one.

Types of serpentine connectors supported are: clamped, maple block and Berg style. They cover both discrete wire connections to paddle cards and ribbon cables terminated to IDC and discrete Mini PV connections.

For serpentine connectors the SERPHDWR table 206 is searched for the rest of the associated hardware. The search is based on the style of serpentine connector (B, E, I or M). Once the correct style entry is found, the extra connector part number is added to the minibill 226 with a label of 'connector' for styles B and I and a label of 'card guide' for all other styles. The part number count is based on the maximum number of pins. If 48, the count is two; otherwise the count is one. For all serpentine connectors except style B, the strain relief part number is also added to the minibill 226. The part number count is two if the style is E or M and the number of pins 48; otherwise the part number count is set to one.

Also for styles E and M, a clamp and a rivets entry must be added to the minibill 226. The count depends on the number of pins. If 48 pins, the clamp count is two and the rivets count is four; otherwise the count is one for clamp and two for rivets. Unused fields in the SERPHDWR table 206 are blank.

SELECTOR 200 supports several configurations of subminiature D connectors. Subminiature D strain relief types supported include metal shells, plastic shells, molded or no strain relief. Also included is a convention to designate thumbscrews of various thread sizes.

For DSUBMIN connectors, if the strain relief type is other than 'none' the DSUBSRPN table 206 is searched for more hardware. Based on the connector part number and the strain relief type, the strain relief part number entry is added to the minibill 226 with a count of two. If the connector size field (taken originally from the Pnnnnnnn size information field) is not empty, the DSUBSCRW table 206 is searched for a screw and insert part numbers. If a match is found on connector part number and connector size information, the screw part number is added to the minibill 226 with a count of two. If there is also an insert part number, it is added to the minibill 226 with a count of two.

Berg connectors (BERGMIN and BERGMAX) do not have associated hardware. In order to verify the connector part number, the BERGSIZE table 206 is used to search for a match between the correct connector part number and size information.

After building the entries in the minibill 226 for the connector and its associated hardware, the terminals associated with the connector must be added. The temporary TERMINAL table 214 is searched for a match based on the device header. If found, the entry is marked as processed and the terminal entries are totalled and entered into the minibill 226 for each different terminal part number found under that device.

Once all connector minibills 226 have been built, the temporary TERMINAL table 218 is searched for those devices that have not been processed in order to build terminal minibills for them. First a header is built, the entry is marked as used and the terminal count is totalled based on the terminal part number. The terminal entry is added to the minibill 226. If a tubing entry is needed, the SLPRNGSP table 206 is searched for a match on the terminal part number. If the tubing field is not empty, an entry in the temporary tubing table, not shown, is added, with the tubing part number and a count equal to that of the related terminal.

If no errors have been found in the processing of the previous sections, steps 202, 216 and 224, SELECTOR 200 continues to the next step 228, which builds the second part of the bill of materials output table 238a. The bill of materials 238b comprises three parts: wire information, minibill information totalled and special notes information.

The second part of the bill of materials table 238a is the minibill information 226 totalled. First the minibill table 226 is sorted by the type of entry (description) and then by part number. The entries are totalled based on the part number. The order in which entries are sorted is: connectors, strain reliefs, terminals, adapters, card guides, clamps, rivets, screws and tubing.

SELECTOR 200 builds a wire point-to-point (WIREPTPT) table 234 by the use of three data sets: Pnnnnnnn 204, temporary WIRE table 208 and TERMINAL table 218.

Wire point-to-point table 234 and pin tables 230 for different devices are created by step 232 from data 206, 208, 218 and 214. Only three styles are supported for pins: CPC, ELSI and MNL.

For each of the different styles there is an array with the list of valid pin positions. The output is based on this list.

Table XXI discloses a list of available ranges of pin names. It is used to keep track of pins used by each device. If more than one wire terminates at the same pin name, the pin in the pin tables 230 is counted only once when accumulating terminal quantities.

TABLE XXI

| Current Available Pin Names (By Style) |
| --- |
| For ELSI H/V3/V6 |
| B02 to B13 |
| D02 to D13 |
| G02 to G13 |
| J02 to J13 |
| For ELSI T |
| W02 to W22 |
| X02 to X22 |
| Y02 to Y22 |
| Z02 to Z22 |
| For MNL |
| 01 to 15 |
| For CPC |
| 01 to 63 |
| For BERG |
| A01 to A40 |
| B01 to B40 |
| X01 to X40 |
| Y01 to Y40 |
| For SERP |
| B02 to B13 |
| D02 to D13 |
| G02 to G13 |
| J02 to J13 |

Next, step 236 creates the first part of the bill of materials table 238b, containing wire information. The TEMP wire table 208 is sorted by part number. The lengths of the entries with the same part number are totalled and written to the bill of materials table 238b.

Step 236 then computes the third part of the bill of materials table 238b, containing miscellaneous information described below. Each individual entry in the Pnnnnnnn 204 is processed sequentially. If any 'T' (for twisted pairs) or 'X' (for coax) lead is found, a flag is set. If the purpose field of the lead is UNUSED or SPARE, the lead number is saved to be included in the unused and spare list.

SPARE wires are counted for all purposes except they are always unterminated, which includes unconnected. SPARE wires do not have a terminal associated with them.

Notes indicating which wires are UNUSED or SPARE are appended to the bill of materials 238b.

Once all the entries have been processed, the notes are written in a note file, not shown, which is part of the bill of materials 238b. Available notes are:

'Last wire number used- XXXX'*
'Unused wire numbers- AAAA, BBBB, CCCC, etc'**
'Unused wire numbers- None'*

-continued

'Spare wire numbers- AAAA, BBBB, CCCC, etc'**
'Wire numbers in parentheses in same terminal'*
'S/T - Skin and Tin'*
'"T" - indicates black lead of twisted pair'**
'"W" - indicates shield or drain wire'**

* Notes that are always produced
** Notes that are produced only if there are any entries for that type of wire

CATIA Mechanical Design System

CATIA 34 (FIG. 1) represents collections of load modules in which each collection has several or many modules. The preferred embodiment uses three of these collections. The first is the basic three dimensional design group and the second is the solids package. These two collections have sufficient function to collect the solids that form a template and allow the designer to design a cable in three dimensions. The third collection of CATIA 34 contains the CADAMW function which is used to transfer CATIA geometry to CADAM 32.

Each CATIA user has MAP and DON data sets, with a name in the format 'CATIA.XXX.Cnnnnnn.MAP', where XXX is the product group and nnnnnn is the individual designer's ID number.

The geometry input to the CATIA model 34 enables the cable designer to analyze the design with respect to mechanical design, orientation and also to produce a CADAM drawing with an isometric view of a cable.

One of the advantages of the preferred embodiment is the quality of cable installation drawings, which display the cable in place, highlighted or in color while background solids are of normal intensity or in a contrasting color. Assembly instructions created therefrom are pictorial rather than descriptive.

Figure 8:
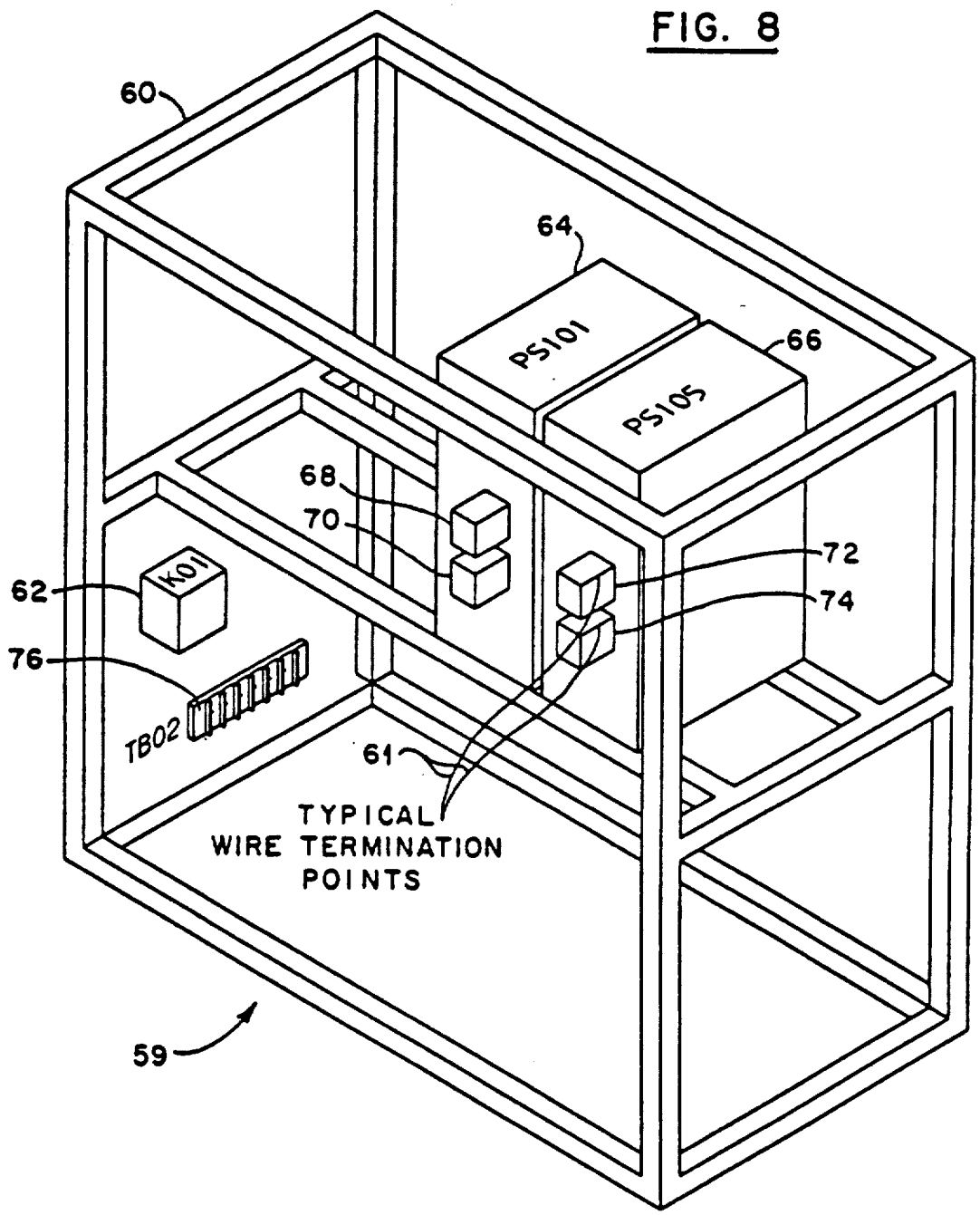
FIG. 8 is an isometric view of a three dimensional template that can be produced in accordance with the present invention.

Referring now also to FIGS. 8-14, the geometric design of a sample wire in accordance with the present invention is described as follows. Referring now to FIG. 8, there are shown nine solids that form a three dimensional template, shown generally at reference numeral 59, and the points at which wires, not shown, will terminate. Specifically, a frame or rack 60 has a circuit breaker 62 mounted thereon. Two power supplies 64 and 66 are provided. Mounted on each of the power supplies 64 and 66 are two power connectors 68, 70 and 72, 74, respectively. A terminal block 76 is mounted on the frame 60 and below the circuit breaker 62.

Figure 9:
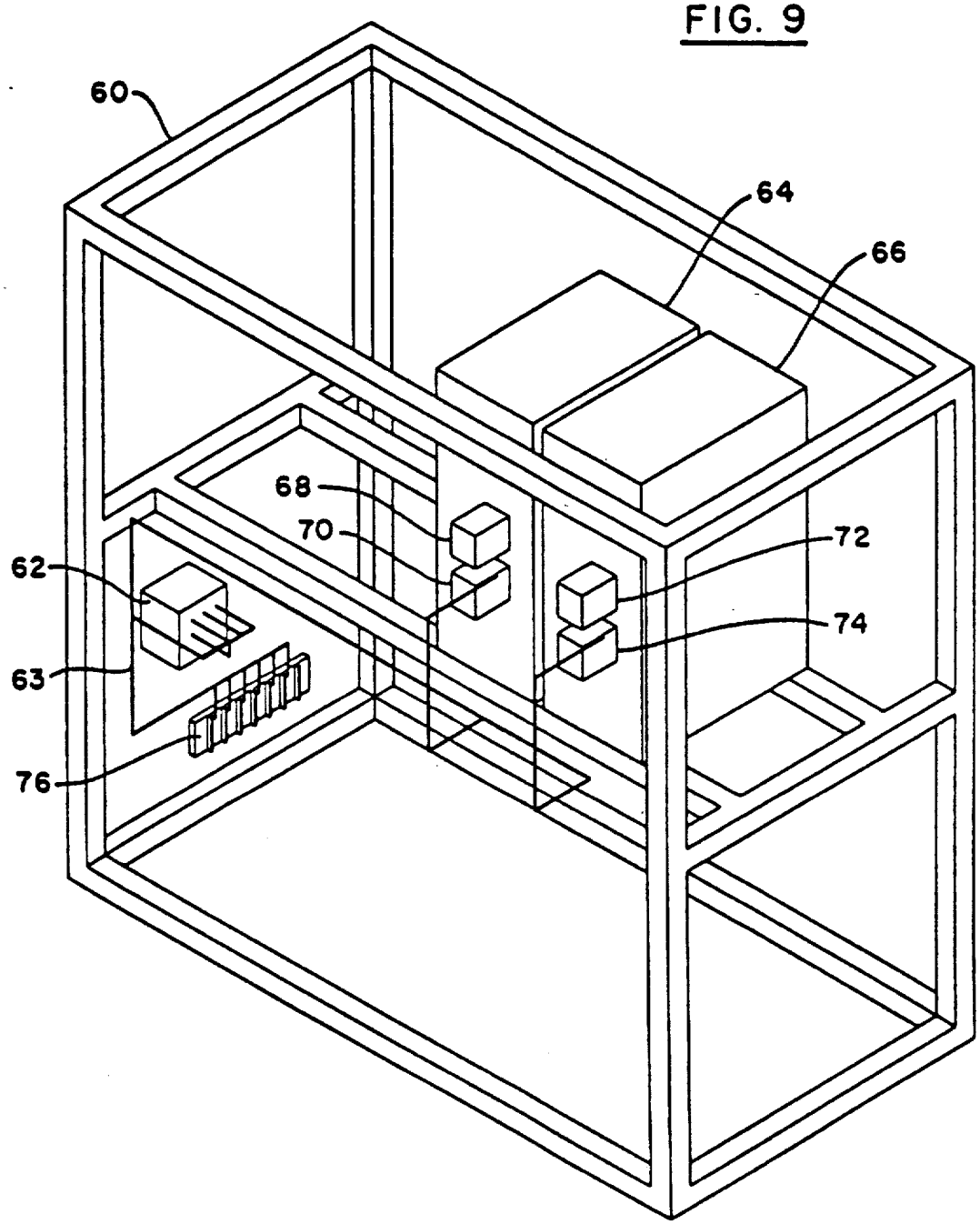
FIG. 9 is an isometric view of the three dimensional template of FIG. 8 further depicting wire frame paths using three dimensional lines.

Referring now also to FIG. 9, the wire path is designed by first creating other points offset from the frame 60, and connecting the points to form line segments 63. The collection of line segments 63 is called the wire path.

Figure 10:
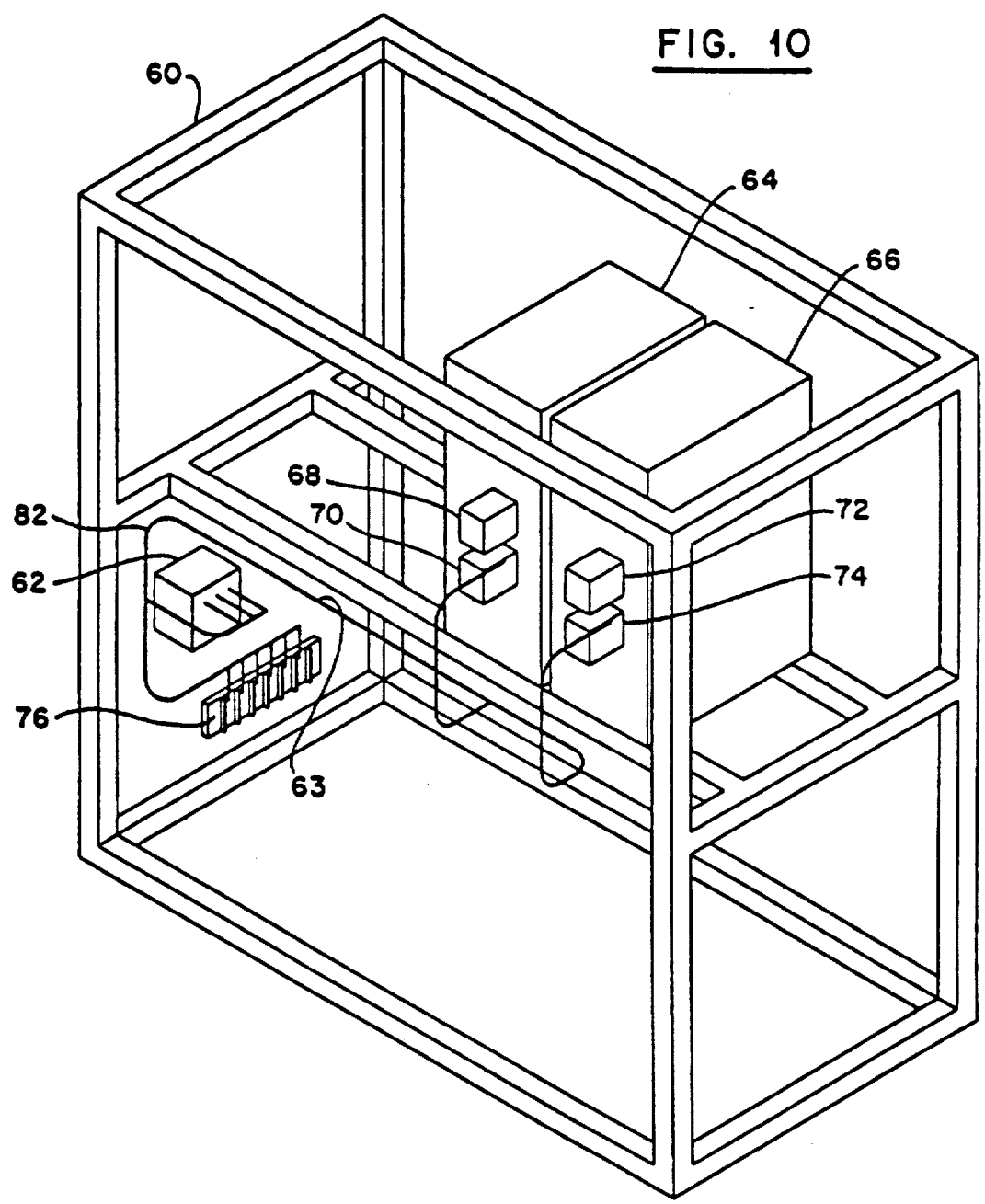
FIG. 10 is an isometric view of the three dimensional template and wire frame paths of FIG. 9 further depicting curved corners.

Referring now also to FIG. 10, the wire path 63 may optionally be further designed by creating circular arcs 82 curves, not shown, or splines, not shown, at the intersection of line segments 63.

Figure 11:
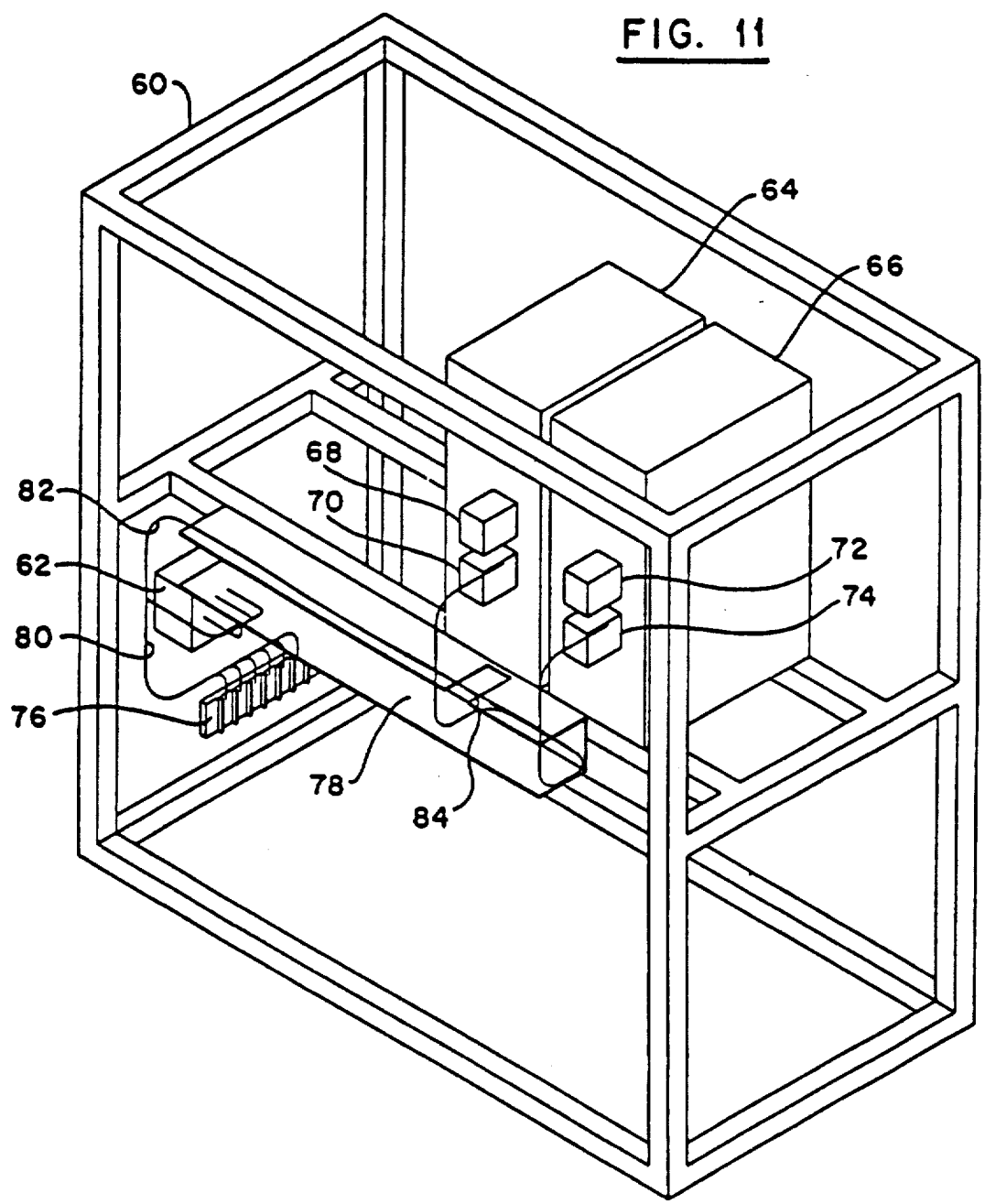
FIG. 11 is an isometric view of the three dimensional template of FIG. 10 further depicting a cable raceway.

Referring now also to FIG. 11, a raceway 78 is shown superimposed on the three dimensional frame 60 with the geometric sections of the wire paths. Wire path sections include lines 80, circular arcs 82 and splines 84.

Figure 12:
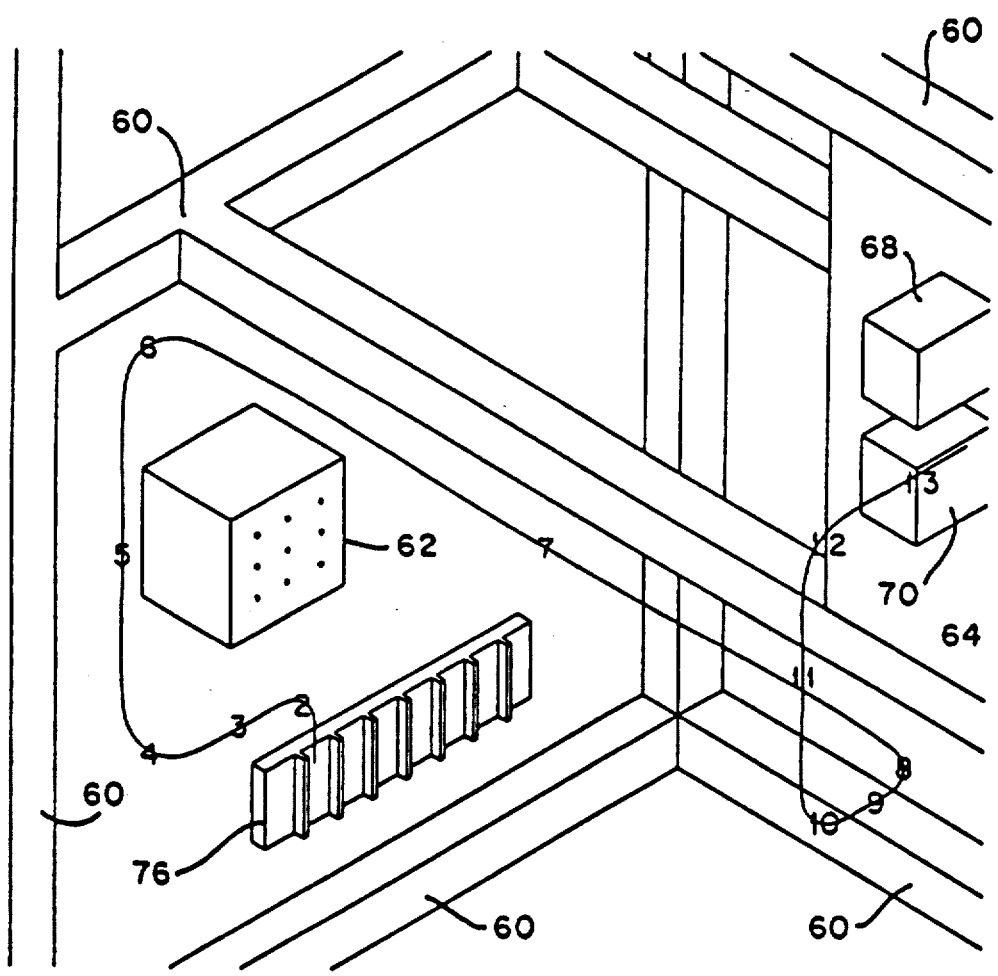
FIG. 12 is an exploded isometric view of the template of FIG. 10 further depicting one wire lead as a 13-section CATIA curve.

Referring now also to FIG. 12, there is shown an individual wire 100, including wire path construction lines, arcs and curves.

Figure 13:
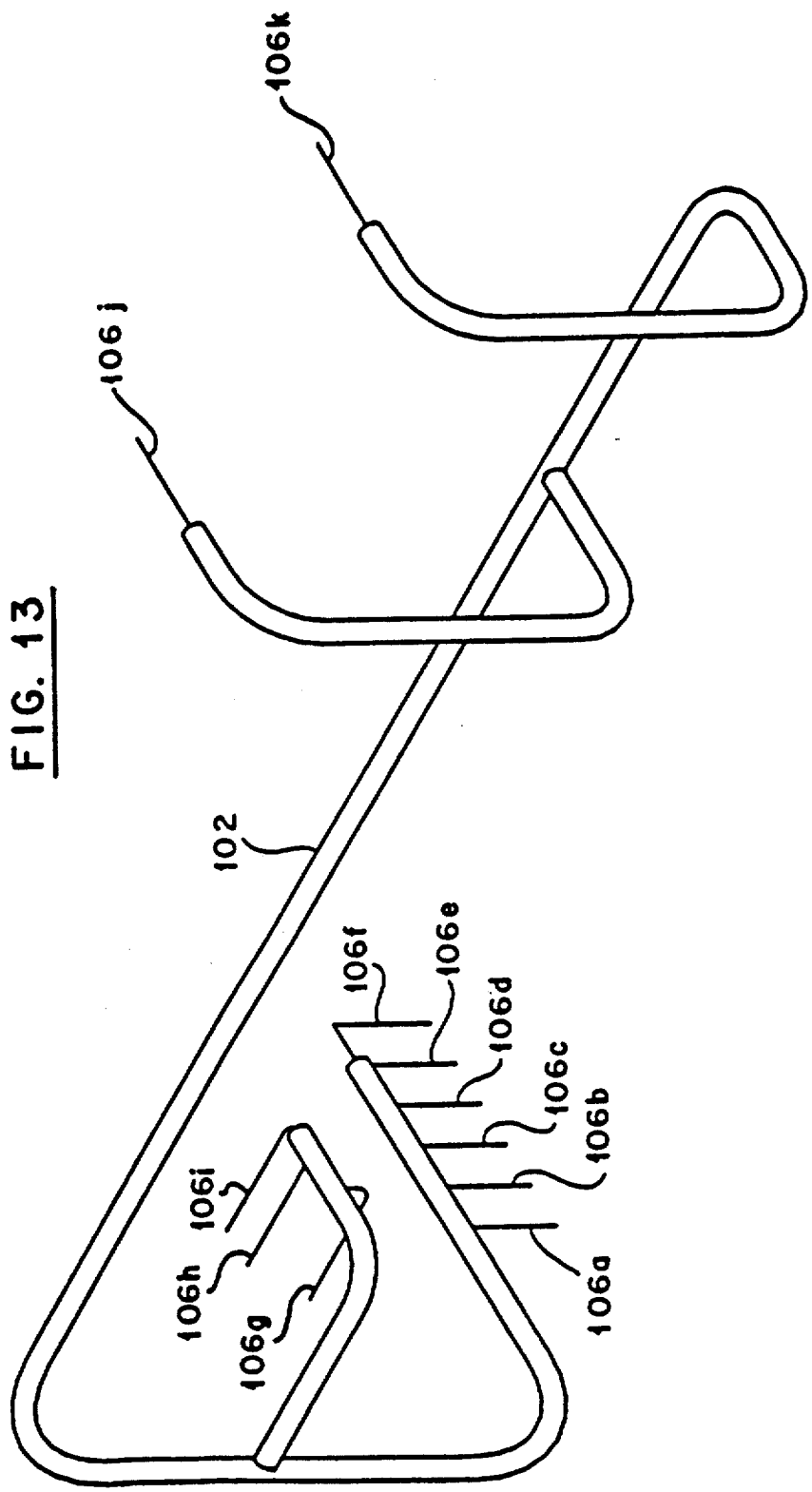
FIG. 13 is a solid representation of a cable with wire leads.
Figure 14A:
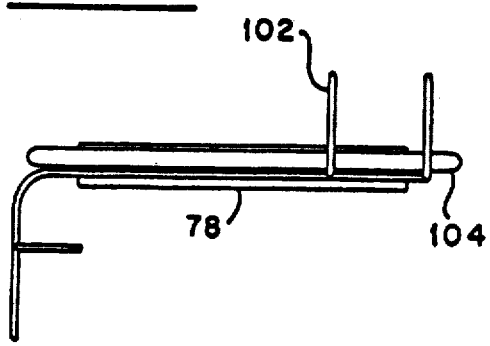
FIGS. 14a–14d taken together show different views of a raceway and two cables.
Figure 14B:
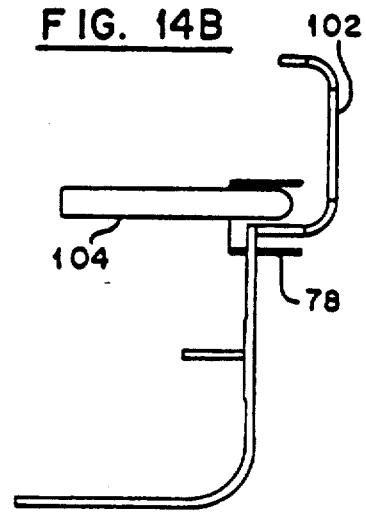
Figure 14C:
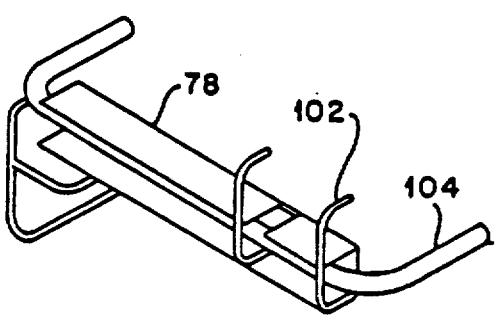
Figure 14D:
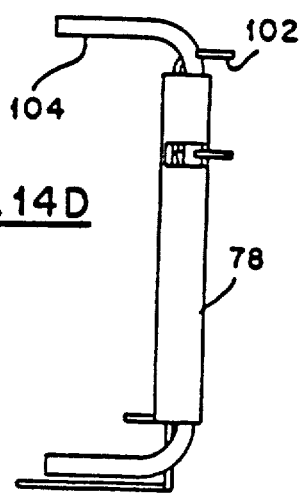

Referring now also to FIG. 13, there is shown a CATIA pipe solid 102 and wire leads 106a–106k.

Referring now also to FIGS. 14a–14d, there are shown four views of a bulk cable analysis for the raceway 78. The user estimates the diameters of the sections of cable by scanning the cable descriptions. The pipes 102 and 104 are solids. Interference analysis is first visual and can be tested by using the CATIA intersection operator.

Several cables and the template may be in the same model while performing bulk cable analysis, but must be filed separately so that the user can manage the data efficiently.

The first and most important step in the geometric part of the design procedure is the creation of a CATIA model that contains the electromechanical components or devices 62, 64, 66, 68, 70, 72, 74 and the structural supporting components, such as the frame 60 and raceway 78, used by the cables 102. This model is referred to as the template 59 and is used for all design and analysis work. The template 59 must have accurate termination point location, but conceptualized connector representations, such as are identified by reference numerals 68 and 76, for example, are usually sufficient. This is fortunate because off-the-shelf parts such as connectors may not be available as fully detailed three dimensional models.

The three dimensional template 59 may be provided by other mechanical designers in the group, or the cable designer 402 may be responsible for collecting three dimensional designs from those designers. The template 59 can also include any parts to which the cable connects either electrically or mechanically and any nearby parts that might cause interference. Interference includes direct contact with another installed part and includes situations (e.g., insufficient manual or robotic assembler space) that might interfere with installation of the cable itself.

The product template 59 may be too large to exist in a single model. Cable design of a single cable does not require the entire template 59, but only a subset specifically related to a cable or group of cables. CATIA 34 allows the total template to be subdivided into smaller templates.

With a completed template 59 available, the process of determining wire path 80, 82, 84 can commence. Using the data in WIRELIST 400, the point to point information 18 needed for each cable assembly is scanned. This can be done by having a printout, a second terminal or optimally an IBM 5082 system with the 3270 emulation capability.

Color coding of components (e.g., circuit breaker 62) and wire termination points 61 are helpful as a large number of points 61 are created in CATIA 34. Color coding helps differentiate other points from wire termination points 61. The amount of detail required for electromechanical components, other than off-the-shelf parts, is discretionary with the individual designer 402.

Next, the designer 402 examines the point to point data 18 to establish the most effective routing with respect to cable type and complexity. For example, AC cabling should not be run near DC, Sense or Signal cables. Frame members should be selected to use for the cable routing. These decisions are made without entering any model data.

By using the LINE, POINT and PLANE functions of CATIA 34, a straight line cable path 63 can be created to simulate the cable routing with respect to the template 59. By using the CORNER function within CATIA 34, cable bend radii 82 can be added. These radii 82 are determined by the designer 402 and are based on wire type, number of wires and their proximity to adjacent hardware.

Wires 100 are created in CATIA 34 by concatenating line segments 63, curves 82 and splines 84. This operation can be simplified by using the automatic concatenate feature in CATIA 34.

The resultant element 100 represents the individual wire between the two termination points 61 and inherently contains length data extracted by GETLEN 114 (FIG. 6).

Using the duplicate function within the OPERATE function of CATIA 34, the concatenated wire 100 is selected. This creates another wire 100 in the same place of the model. Using the IDENTIFY function in CATIA 34, the duplicated wire 100 can be selected.

The wire 100 is renamed with a five digit wire identification number, the first digit being W. For example, to route wire 1, the wire identification is W0001. In the case of twisted pairs, if the colored wire is W0001, the black lead is WT001. This naming is consistent with WIRELIST 12. The renamed wire 100 is now NO-SHOWed to keep the model as clean as possible.

By using the BREAK application of the LIMIT function, the original concatenated wire 100 is broken and re-concatenated with other line segments, curves and splines to simulate the next wire. Judicious selection of specific break points facilitates creation of the next wire by reducing the number of sections that must be concatenated. The same procedure is followed for all wires listed in the WIRELIST data 18 for that cable.

By viewing all of the model elements through the IDENTIFY function, all of the wire identification names for all of the wires in the cable can be viewed. These names are used to transfer the wire length data from CATIA 34 to the cable description 132 (FIG. 6) and eventually to the cable assembly drawing. The wire identification names must match the wire names in the cable description.

Several cables may be added to the model for bulk cable analysis. The bulk cable analysis is useful in areas of high cable concentration where buildup is likely to occur.

Both the position and size of raceways 78 can be determined by performing the bulk cable analysis in CATIA 34. This cable bulk analysis data can be transferred back to the other mechanical designers in the group. Designs and layouts can then take into account specific and justified cable requirements.

CATIA 34 can create pipe solids 102 and 104 given the lines and curves representing the center lines 63 of the pipes 102 and 104. When cables have more than two ends, the UNIONing of several pipes is required. Pipes can be created in individual sections or the center line constructs can be combined first into a concatenated curve which is then used to make the pipe.

The core or center of the bulk cable should be offset from any surface by at least half the diameter of the cable. Bulk cable diameter is not provided by the system 34 and must be estimated by the designer 402.

A rule of thumb that may be applied to bend radii is that any breakouts or T-intersections in a cable path should be drawn with 90 degree lines initially.

Figure 15:
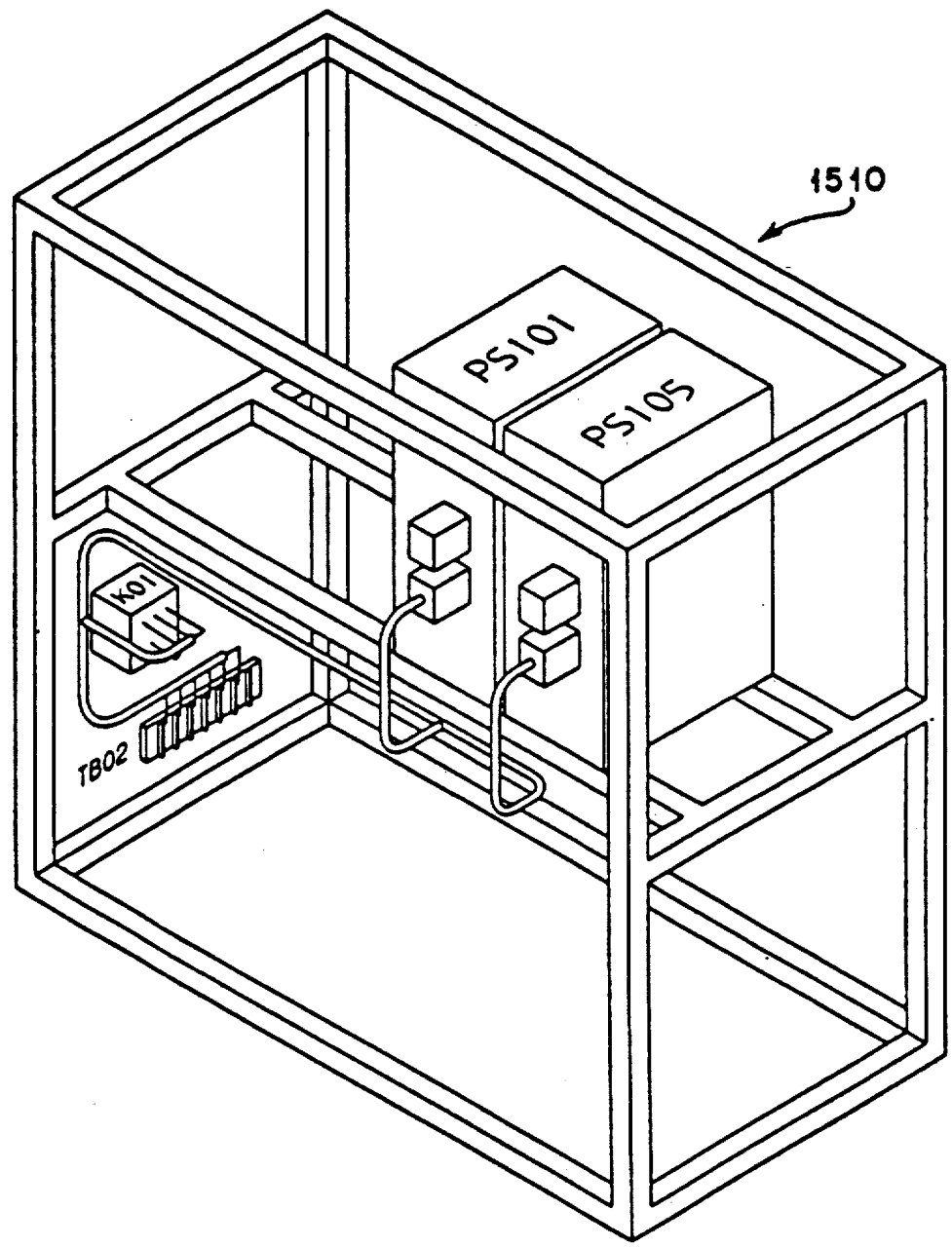
FIG. 15 is an isometric CATIA view of the template and cable when downloaded to CADAM.

Two downloads are required. The cable assembly download comprises only the geometry shown in FIG. 13. The cable installation download comprises the geometry shown in FIG. 15.

To download with parallel lines already present, a pipe solid 102 in CATIA 34 is constructed using the cable path 63 as a pipe center. The cable designer 402 decides where to place the parallel lines 102 and constructs the pipe solids accordingly. Several pipe solids 102 may have to be created and UNIONed together to generate a single solid that represents a laced cable body. The unlaced ends of the cable 106a-106k are not shown as solids. The diameter of the pipe 102 is not necessarily related to prior bulk cable analysis diameters.

After designing a cable 102 in CATIA 34, various elements of geometry are no longer needed. Before using CADAMW, the user 402 should discard unnecessary items. The template 59 can be saved if the user 402 elects to have the template 59 stored with the cable 102, but should not be shown for the assembly download. The center line constructs 63 used to make the pipe 102 are not shown either.

When sequential assembly of cables 102 is required, cables to be installed earlier in an installation sequence are added to the model. Hidden line removal is accomplished in CATIA 34 automatically.

The final operation in model preparation is to NO-SHOW the cable wires 100 and wire path 63 with the exception of any leads 106a-106k outside of the laced cable 102.

Within each CADAM group, there is a subgroup called CATIA. It is the subgroup which is used when CATIA data is downloaded to the CADAM group, called 'CABLE OUTLINE MODEL'. If the user 402 executes the SELECTOR CLIST 110 first and places the results in the CATIA subgroup of his CADAM group, then he can specify the same model name during download and the geometry is placed into a detail of the same model. The system 110 uses a new model name, however, as the part number.

Transfer of the CATIA model to CADAM is performed using the CATIA function CADAMW. The CATIA model should show only geometry to be downloaded. CADAMW lists the CADAM groups and subgroups allowed. The user 402 selects the proper group, then selects CATIA and types the CADAM model name. The model is downloaded with a final message of MDL (model) FILED.

If the template solids as well as the cables are visible in CATIA before download, they are downloaded together.

Dimensioning in CADAM often requires preparation in CATIA. The analysis function yields the length of a CATIA curve or cable wire. When the length of a subsection is required, the wire is BREAKed at the section end points and then ANALYSIS is performed.

Dimensions are drafted only among cable ends, breakouts and functional bends. It is not necessary to analyze every line segment, spline and so on in the wire path 63. The dimensions are then pencilled in on a plot for later entry on the CADAM model.

In different situations, either of two functions might be more productive than the other. Similarly, one function might be more productive in CATIA but leave more work to be completed in CADAM.

The cabling system of the present invention uses CATIA to define the length of each wire 100 accurately. Operationally, this length may be too short. This phenomenon seems to occur because the cables are usually manufactured on a two dimensional pegboard and then coiled and bagged for shipment to an assembly area. Uncoiling leaves the cable short by an unknown amount, but one that can be measured empirically. Parameters affecting the shrinkage include the length between functional bends, the number of wires and the wire size. Other effects that leave unmeasurable changes are the tightness of the coil and the effort spent trying to straighten it.

The user 402 need not add bend radii. If the wire path 63 contains only line (not curved) segments, the cable will be longer, approximately compensating for shrinkage caused by twists associated with two dimensional manufacturing processes and deliveries. Empirical data can measure these two effects.

Geometrically accurate CADAM models are easily dimensioned. For that reason, it is in the user's best interest to have geometrically accurate models whenever possible. Scaling and downloading sometimes provides ways to maintain the CATIA accuracy even after downloading.

Orthogonal cables are cables comprising three dimensional line segments, each of which is parallel to either the X, Y or Z axis.

If cables tend to be orthogonal and the above restrictions apply, then the downloaded results in the CADAM model will be geometrically accurate after the user 402 scales the view up by a factor of 1.22474. This accounts for a projection factor of a CATIA isometric view. Alternately, the CATIA model can be scaled up by the same factor before downloading.

CATIA can allow the cable designer 402 to create a cable representation as either a solid, a wire frame or even a surface representation.

CATIA solids are always facetted polyhedral representations. The representation on the display comprises line segments alone. When CATIA solids are downloaded to CADAM, only CADAM line segments are created. One advantage of downloading solids is that, before download, the hidden lines can be removed so that they do not appear in CADAM.

Wire frame constructions are most productive if the design includes only the center line data. Downloading transfers any curved CATIA constructs as CADAM splines.

CATIA allows the user to change line thickness but CADAMW downloads only medium solid, medium dashed, fine solid and fine dashed lines. Ideally, a line thickness displays the cable and, in the background, its installation location. Solid representation in CATIA can be changed in one step to light lines, which appear as fine lines in CADAM. In CADAM lines can be heavy, medium or light. In a CADAM model, the user still must change a cable to heavy lines for contrast.

CADAM Two Dimensional Design and Drafting System

A fully operational interactive CADAM system and the CADAM model named 'CABLE OUTLINE MODEL' are required.

CADAM databases are managed by group, each of which can have a large number of subgroups or USERIDs. Most subgroups are password protected. Direct IUE access is impossible in those cases. Since the preferred embodiment uses the IUE, two subgroups without passwords named IN and CATIA are required. Data can pass from CATIA to IN using the ALL program 124 (FIG. 6), conmprising the IUE and subsequently can pass to the user's subgroup, with or without passwords, using the utility NURESTOR 126.

Furthermore, within each CADAM group, the CATIA subgroup is used when CATIA data is downloaded to the CADAM group. This CATIA subgroup is also the source for the special outline model called 'CABLE OUTLINE MODEL'. The ALL program 124 opens this model for input within SELECTOR CLIST 110 and files the results the IN subgroup.

If the user 402 executes the SELECTOR CLIST 110 first and places the results in the CATIA subgroup of his CADAM group, then he can specify the same model name during download and the geometry is placed into a detail of the same model.

As indicated hereinabove, the menu 112 asks for the user's subgroup. This is used twice: once to reach the correct CATIA group 50 and once to move the resultant CADAM model 140 to the password protected user's subgroup in CADAM. The system 110 does this using NURESTOR 126 in three steps. First, a copy of the CADAM model is unloaded from the CADAM database 138. Second, that copy is loaded into the user's subgroup even if it is password protected. Third, NURESTOR 126 deletes the original copy in the IN subgroup. This third step cannot be executed unless the first two are successful, thus guaranteeing that the CADAM model is not lost. Subsequently, the user 402 must combine the administrative data loaded by ALL 124 and the downloaded geometry from CATIA 49.

CADAM provides several variations of a procedure that can be used to move the geometric view from one CADAM model into the model with the administrative data. The preferred embodiment procedure is to transfer a view from one model to a detail of another model using the DETAIL key and then to USE the detail in the primary view of the administrative model.

Data downloaded to CADAM appears as it did in CATIA but significant differences occur. Circular arcs seen in a CATIA isometric view become CADAM splines, but line segments in bulk cable drawings remain as straight lines, even though they appear to be curves. For these reasons and others, CADAM final editing by means of REDRAFT software 54 (FIG. 1) must be performed.

Most of the final editing in the CADAM model is work that exists in conventional cable design methodology and that has not been fully automated. In some cases the CADAM final editing replaces conventional steps which were partially automated.

Two CADAM drawings are produced for each cable harness. The first sheet is used to build the cable assembly and the second is the cable drawing to install the cable. The Sheet 1 drawing describes how to build the cable assembly. Medium line intensities are adequate, so no line type changes are required.

Referring now also to FIG. 16, the point-to-point wiring table 1610 and the bill of materials 1612 and notes 1612 are loaded to the CADAM model 30 as a direct output of the administrative process (FIG. 2). Also shown are the pipe solid 1614 and cable leads 1616 into the CADAM model 49 downloaded directly from CATIA using CADAMW. Minibill data, not shown, and the pin tables, not shown, are also in the CADAM model 30. The two CADAM models 30 and 49 are already combined either by preliminary operations 32 or by judicious choice of model naming wherein the CATIA download is made to the CADAM model 32.

Figure 17B:
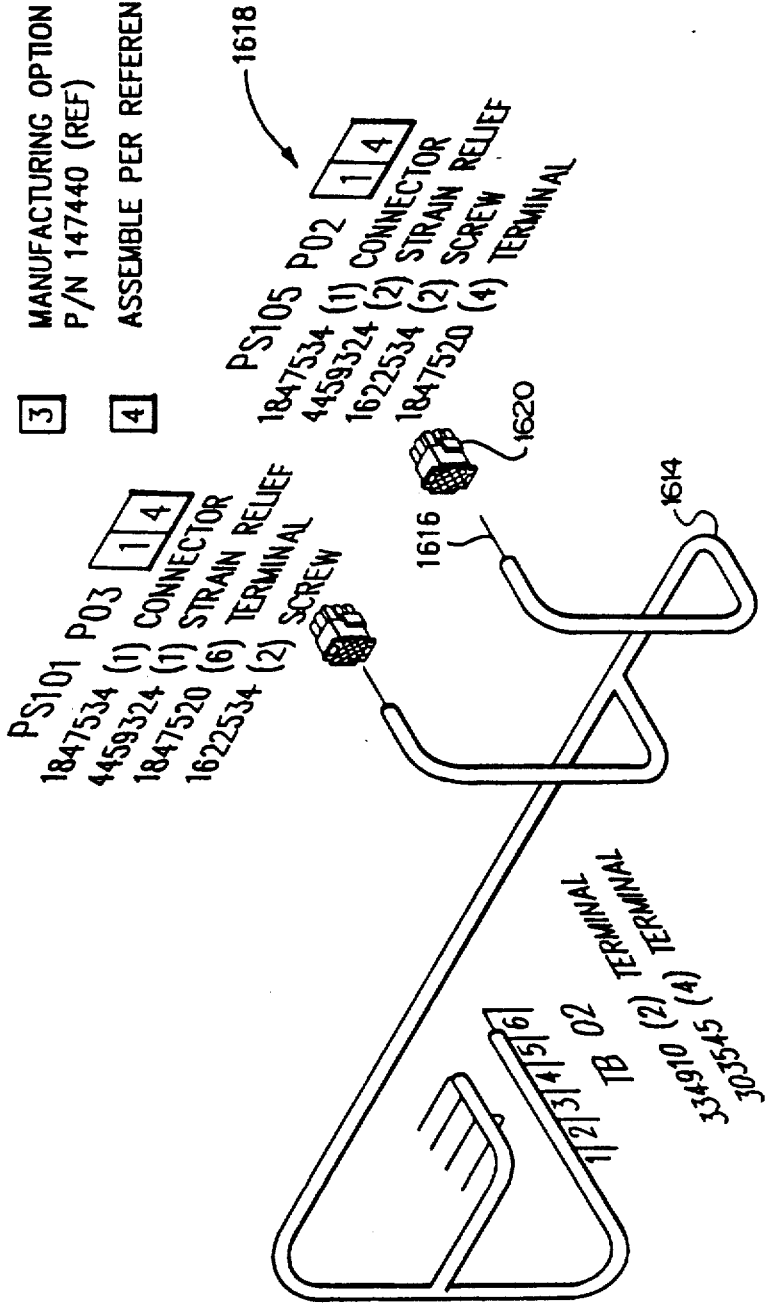
Figure 18A:
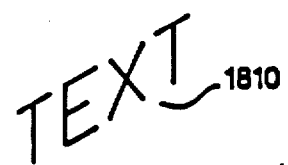
FIG. 18 shows text printed in five combinations of text angle and slant angle.
Figure 18B:
Figure 18C:
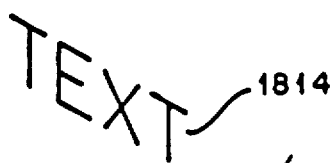
Figure 18D:
Figure 18E:
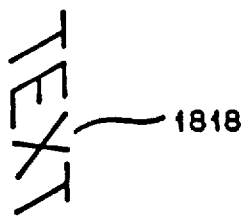

Referring now also to FIG. 17, minibill data 226 is shown. The relevant portion 1618 of the minibill 226 is moved by the user 402 onto the CADAM drawing near the appropriate cable end 1616. Since SELECTOR CLIST 110 does not have the position of those ends 1616, the minibill 1618 is initially placed outside the outline, not shown, in the primary view.

Referring now also to FIG. 18, the NOTE function key is used to slant the text angle to preserve the three dimensional appearance of the minibill data 1616. These isometric text strings help retain the appearance of a three dimensional image in CADAM, even though the geometry is two dimensional. The text angle can be either +30 degrees 1810 and 1812 or −30 degrees 1814 and 1816 or 90 degrees with the slant parameter set at −30 degrees 1818 depending on the geometry. Different combinations of text angles and text slant angles provide three dimensional perspective for dimensioning, minibills and device locations.

Certain isometric views of connectors used in previous products may be collected and stored in a standard library subgroup, not shown, of a CADAM group. From this CADAM standard library of connectors, views of the connectors 1620 can be transferred to the CADAM model and located near the correct cable ends 1616.

Similarly, CADAM details of strain relief hardware exist, but the user 402 must display the correct number and orientation of associated hardware. In the past this often was handled by text notes, but a geometric picture in accordance with the present invention results in improvement in quality.

Referring now also to FIG. 19, auxiliary views can be created by capturing an area of dense information 1624, copying it and then scaling it up 1626. Minibill information 226 can then be added without scaling it to produce unambiguous geometric representations 1624.

Dimensioning techniques for cables are constructed as offsets of sequences of geometry. The ends of dimensions 1622 are bounded by a functional breakout 1632 and a connector 1620 or another functional breakout 1634. The dimension line 1628 is created by offsetting its associated line 1630.

The location of a functional bend, not shown, is identified with radius and locating dimensions. The dimension 1622 appears three dimensional even though the isometric view in CADAM is two dimensional.

The dimensioning technique requires that the cable designer create a CATIA plot. In CADAM, dimensioning of isometric drawings requires manual creation of extension lines, dimension lines and dimensional text. Then, using the rule that cables are dimensioned only to breakouts and functional bends, the designer adds the dimensional data that was recorded on the CATIA plot.

Referring now also to FIG. 20, the point-to-point wiring data originally shown in FIG. 16 as reference numeral 1610 is shown in an exploded view in FIG. 20. Tabular headings and line sections are created by ALL 124 and loaded into CADAM thereby. The wiring data is accumulated by SELECTOR 122 and included in the table 1610 by ALL 124, without user software intervention.

Figure 21:
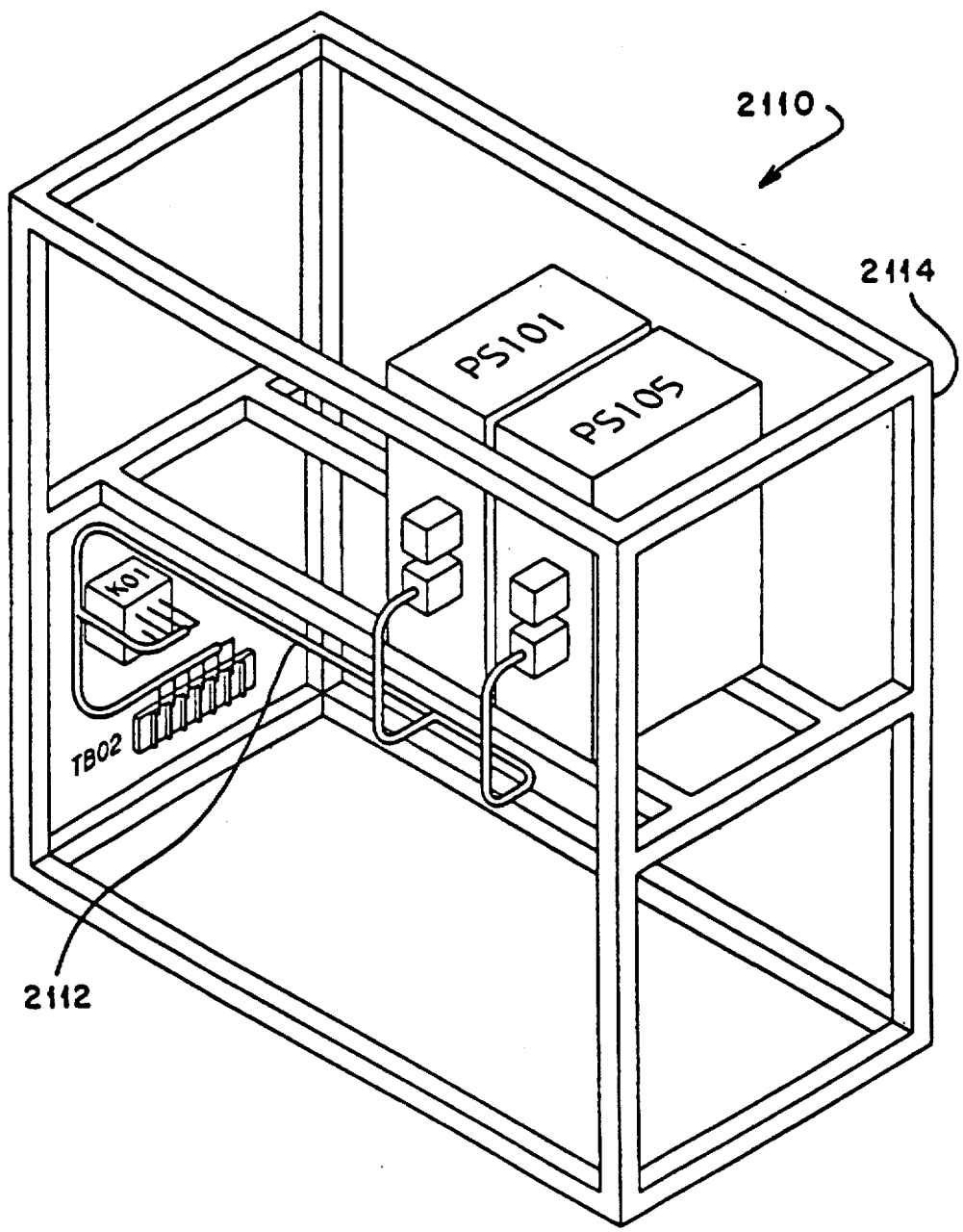
FIG. 21 is an isometric view of the completed cable routing/installation drawing.

Referring now also to FIG. 21, CATIA view 1510 (FIG. 15) is downloaded to produce Sheet 2, the cable installation drawing.

In the Sheet 2 drawing 2110, cable routing data requires CADAM heavy solid lines 2112 for the cable and light solid lines 2114 for the background hardware. Heavy lines 2112 cannot be sent down from CATIA so the user 402 must set these appropriately with the CADAM/TYPE function.

When sequential assembly of cables is required, previously installed cables are collected into one CATIA model. These cables are then combined with the template 59 and the new cable 102. Hidden line removal is accomplished in CATIA automatically. Then the results, not shown, are transferred to CADAM. In CADAM, a note referencing the previous cable number is included at a predetermined location on the CADAM model.

Downloaded concatenated curve data is received in CADAM as splines, not shown. Running the geometry through REDRAFT 54 splits this geometry into line segments and circular arcs, where possible, and leaves the remainder as CADAM splines.

Since other modifications and changes varied to fit particular operating requirements and environments will be apparent to those skilled in the art, the invention is not considered limited to the example chosen for purposes of disclosure, and covers all changes and modifications which do not constitute departures from the true spirit and scope of this invention.

What is claimed is:

1. A system for designing a cable for use within a product, said system comprising:

a data input system comprising a database, means for inputting plan of record cabling information into said database, and means for inputting cable description information into said database;

a modelling system comprising means for geometrically modelling the cable to determine geometric information about the cable including the length of the cable, said modelling system and said data input system being operable independently of and in parallel with each other to minimize cycle time in designing said cable; and means, coupled to said data input system and said modelling system, for generating a bill of materials based on said plan of record cabling information, said cable description information, and said cable geometry information.

2. A system as set forth in claim 1 further comprising means, coupled to the bill of materials generating means, and said modelling means, for producing isometric drawings of the modelled cable including associated connectors defined by said plan of record cabling information, said cable description information, and said cable geometry information.

3. A system as set forth in claim 1 wherein said data input system further comprises means, coupled to said database, for comparing some of said plan of record cabling information to some of said cable description information in said database to determine if the compared information defines connectors which are compatible with each other.

* * * * *